(12) United States Patent
Sakata et al.

(10) Patent No.: US 8,564,193 B2
(45) Date of Patent: Oct. 22, 2013

(54) LIGHT-EMITTING ELEMENT, LIGHT-EMITTING DEVICE, ELECTRONIC APPLIANCE, AND METHOD OF MANUFACTURING THE SAME

(75) Inventors: Junichiro Sakata, Atsugi (JP); Hideko Inoue, Atsugi (JP); Satoshi Seo, Kawasaki (JP); Nobuharu Ohsawa, Zama (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/541,109

(22) Filed: Jul. 3, 2012

(65) Prior Publication Data

US 2012/0267678 A1 Oct. 25, 2012

Related U.S. Application Data

(60) Continuation of application No. 13/032,671, filed on Feb. 23, 2011, now Pat. No. 8,231,424, which is a division of application No. 11/984,357, filed on Nov. 16, 2007, now Pat. No. 7,911,135.

(30) Foreign Application Priority Data

Nov. 29, 2006 (JP) ................................. 2006-322425

(51) Int. Cl.
*H01J 1/62* (2006.01)
*H01J 63/04* (2006.01)

(52) U.S. Cl.
USPC ........................................................ 313/504

(58) Field of Classification Search
USPC .................................................. 313/498–512
See application file for complete search history.

(56) References Cited

U.S. PATENT DOCUMENTS 6,285,039 B1 9/2001 Kobori et al.
6,531,234 B1 3/2003 Higashi et al.
(Continued)

FOREIGN PATENT DOCUMENTS

EP 0857007 A 8/1998
EP 1342769 A 9/2003
(Continued)

OTHER PUBLICATIONS

Tsutsui et a., "High Quantum Efficiency in Organic Light-Emitting Devices with Iridium-Complex as a Triplet Emissive Center," JPN. J. Appl. Phys. (Japanese Journal of Applied Physics), Dec. 15, 1999, vol. 38/Part 2, No. 12B, pp. L1502-L1504.

(Continued)

*Primary Examiner* — Anh Mai
*Assistant Examiner* — Kevin Quarterman
(74) *Attorney, Agent, or Firm* — Eric J. Robinson; Robinson Intellectual Property Law Office, P.C.

(57) ABSTRACT

A light-emitting element is provided which has a light-emitting layer between a first electrode and a second electrode, where the light-emitting layer has a first layer and a second layer; the first layer contains a first organic compound and a third organic compound; the second layer contains a second organic compound and the third organic compound; the first layer is provided to be in contact with the second layer on the first electrode side; the first organic compound is an organic compound with an electron transporting property; the second organic compound is an organic compound with a hole transporting property; the third organic compound has an electron trapping property; and light emission from the third organic compound can be obtained when voltage is applied to the first electrode and the second electrode so that the potential of the first electrode is higher than that of the second electrode.

10 Claims, 24 Drawing Sheets

(56) References Cited

U.S. PATENT DOCUMENTS

| | | |
|---|---|---|
| 6,603,140 B2 | 8/2003 | Kobori et al. |
| 7,615,925 B2 | 11/2009 | Suzuki et al. |
| 7,674,914 B2 | 3/2010 | Egawa et al. |
| 7,906,226 B2 | 3/2011 | Matsuura et al. |
| 8,084,145 B2 | 12/2011 | Inoue et al. |
| 8,105,701 B2 | 1/2012 | Matsuura et al. |
| 2005/0221123 A1 | 10/2005 | Inoue et al. |
| 2006/0029828 A1 | 2/2006 | Kanno et al. |
| 2006/0051563 A1 | 3/2006 | Okumoto et al. |
| 2006/0051615 A1 | 3/2006 | Kanno et al. |
| 2006/0289882 A1 | 12/2006 | Nishimura et al. |
| 2007/0024168 A1 | 2/2007 | Nishimura et al. |
| 2007/0244320 A1 | 10/2007 | Inoue et al. |
| 2008/0079354 A1 | 4/2008 | Egawa et al. |
| 2009/0140634 A1 | 6/2009 | Nomura et al. |
| 2012/0153267 A1 | 6/2012 | Matsuura et al. |

FOREIGN PATENT DOCUMENTS

| | | |
|---|---|---|
| EP | 1718122 A | 11/2006 |
| EP | 1992672 A | 11/2008 |
| JP | 2005-038763 | 2/2005 |
| JP | 2005-310742 A | 11/2005 |
| JP | 2005-314414 A | 11/2005 |
| JP | 2005-353288 A | 12/2005 |
| JP | 2006-151887 A | 6/2006 |
| JP | 2006-186385 A | 7/2006 |
| WO | WO-2005/079118 | 8/2005 |

OTHER PUBLICATIONS

Goldsmith et al., "C-H Bond Activation by a Ferric Methoxide Complex: Modeling the Rate-Determining Step in the Mechanism of Lipoxygenase," J. Am. Chem. Soc., 2002, vol. 124, No. 1, pp. 83-96.

Onishi et al., "High Molecular EL Materials—Development of Light-Emitting High Molecular Compounds," A Method of Measuring an Energy Level, Dec. 25, 2004, pp. 64-67, Kyoritsu Shuppan.

Seo et al., "64.4: High-Performance OLEDs Based on a New Class of Ir Complexes Bearing Pyrazine Structures in Their Ligands," SID Digest '07: SID International Symposium Digest of Technical Papers, 2007, vol. 38, pp. 1776-1779.

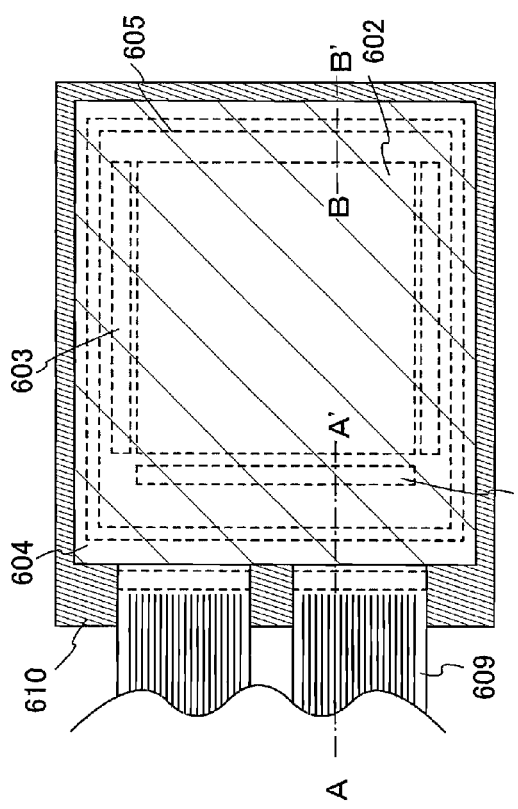
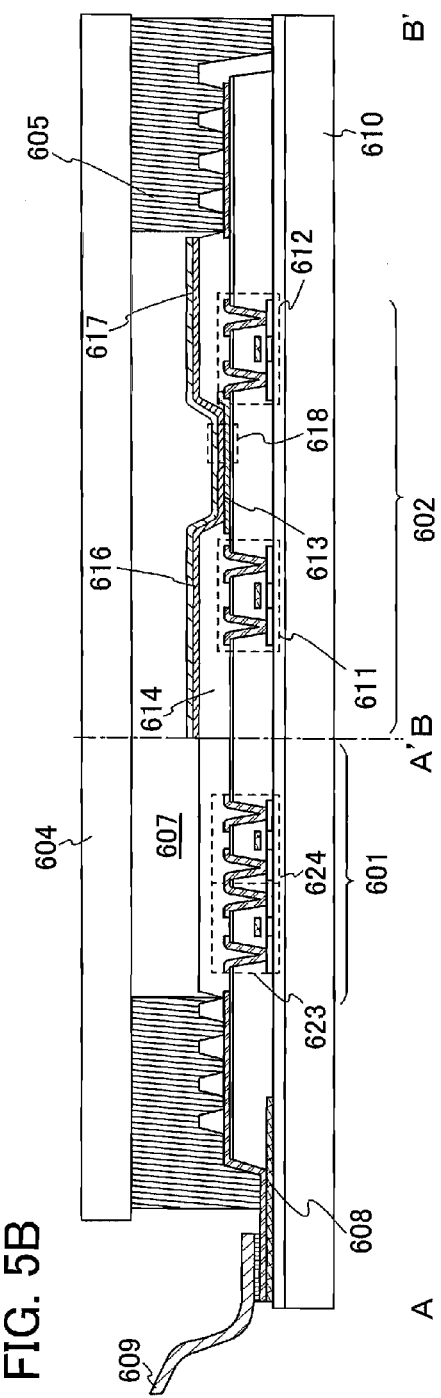
FIG. 5A
FIG. 5B

LIGHT-EMITTING ELEMENT, LIGHT-EMITTING DEVICE, ELECTRONIC APPLIANCE, AND METHOD OF MANUFACTURING THE SAME

BACKGROUND OF THE INVENTION

1. Field of the Invention

The present invention relates to a current excitation light-emitting element, a light-emitting device, an electronic appliance each having the light-emitting element, and method of manufacturing the same.

2. Description of the Related Art

In recent years, a light-emitting element utilizing electroluminescence has been actively researched and developed. In a basic structure of such a light-emitting element, a substance with a light-emitting property is sandwiched between a pair of electrodes. When voltage is applied to this element, light emission can be obtained from the substance with a light-emitting property.

Since such a light-emitting element is a self-luminous type, there are advantages in that it has higher visibility of pixels than liquid crystal displays, there is no need to use a backlight, and the like. Thus, such a light-emitting element is considered to be suitable as a flat panel display element. In addition, such a light-emitting element can be manufactured to be thin and light-weight, which is also a great advantage. Moreover, very high response speed is also one of features of such a light-emitting element.

Furthermore, since such a light-emitting element can be formed in a film form, planar light emission can be easily obtained when a large-area element is formed. This cannot be easily achieved with a point light source typified by an incandescent lamp or an LED, or a linear light source typified by a fluorescent lamp, and thus, such a light-emitting element has high utility value as a plane light source which is applicable to a lighting system or the like.

Light-emitting elements utilizing electroluminescence are broadly classified according to whether they use an organic compound or an inorganic compound as a substance with a light-emitting property.

When an organic compound is used for a substance with a light-emitting property, electrons and holes are injected into a layer containing an organic compound with a light-emitting property from a pair of electrodes by voltage application to a light-emitting element, so that current flows therethrough. Then, when carriers (electrons and holes) are recombined, the organic compound with a light-emitting property is in an excited state, and when the excited state returns to a ground state, light is emitted. Because of such a mechanism, such a light-emitting element is referred to as a current excitation light-emitting element.

Note that there are a singlet excited state and a triplet excited state as the types of the excited states obtained by an organic compound. Light emission from the singlet excited state is referred to as fluorescence, and light emission from the triplet excited state is referred to as phosphorescence.

In improving element characteristics of such a light-emitting element, there are a lot of problems depending on a material, and in order to solve the problems, improvement of an element structure, development of a material, and the like have been carried out.

For example, in Non-Patent Document 1 (Tetsuo Tsutsui and eight others, *Japanese Journal of Applied Physics*, vol. 38, L1502-1504 (1999)), a hole blocking layer is provided, so that a light-emitting element using a phosphorescent material efficiently emits light.

SUMMARY OF THE INVENTION

However, as described in Non-Patent Document 1, a hole blocking layer does not have durability, and a light-emitting element has a very short lifetime. Thus, development of a light-emitting element with high light emission efficiency and a long lifetime has been desired. In view of the foregoing, it is an object of the present invention to provide a light-emitting element having high light emission efficiency. It is an object to provide a light-emitting element having a long lifetime; a light-emitting element having high light emission efficiency and a long lifetime; a light-emitting device and an electronic appliance each having high light emission efficiency; and a light-emitting device and an electronic appliance each having a long lifetime.

One feature of the present invention is a light-emitting element which includes a light-emitting layer between a first electrode and a second electrode, where the light-emitting layer includes a first layer and a second layer; the first layer contains a first organic compound and a third organic compound; the second layer contains a second organic compound and the third organic compound; the first layer is provided to be in contact with the second layer on the first electrode side; the first organic compound is an organic compound with an electron transporting property; the second organic compound is an organic compound with a hole transporting property; the third organic compound has an electron trapping property; and light emission from the third organic compound can be obtained when voltage is applied to the first electrode and the second electrode so that the potential of the first electrode is higher than that of the second electrode.

Another feature of the present invention is a light-emitting element which includes a light-emitting layer between a first electrode and a second electrode, where the light-emitting layer includes a first layer and a second layer; the first layer contains a first organic compound and a third organic compound; the second layer contains a second organic compound and the third organic compound; the first layer is provided to be in contact with the second layer on the first electrode side; the first organic compound is an organic compound with an electron transporting property; the second organic compound is an organic compound with a hole transporting property; the lowest unoccupied molecular orbital level (LUMO level) of the third organic compound is lower than that of the second organic compound by greater than or equal to 0.3 eV; and light emission from the third organic compound can be obtained when voltage is applied to the first electrode and the second electrode so that the potential of the first electrode is higher than that of the second electrode.

Another feature of the present invention is a light-emitting element which includes an electron transporting layer and a hole transporting layer between a first electrode and a second electrode; and a first layer and a second layer between the electron transporting layer and the hole transporting layer, where the first layer contains a first organic compound and a third organic compound; the second layer contains a second organic compound and the third organic compound; the first layer is provided to be in contact with the second layer on the first electrode side; the first organic compound is an organic compound with an electron transporting property; the second organic compound is an organic compound with a hole transporting property; the third organic compound has an electron trapping property; and light emission from the third organic compound can be obtained when voltage is applied to the first electrode and the second electrode so that the potential of the first electrode is higher than that of the second electrode.

Another feature of the present invention is a light-emitting element which includes an electron transporting layer and a hole transporting layer between a first electrode and a second electrode; and a first layer and a second layer between the electron transporting layer and the hole transporting layer, where the first layer contains a first organic compound and a third organic compound; the second layer contains a second organic compound and the third organic compound; the first layer is provided to be in contact with the second layer on the first electrode side; the first organic compound is an organic compound with an electron transporting property; the second organic compound is an organic compound with a hole transporting property; the lowest unoccupied molecular orbital level (LUMO level) of the third organic compound is lower than that of the second organic compound by greater than or equal to 0.3 eV; and light emission from the third organic compound can be obtained when voltage is applied to the first electrode and the second electrode so that the potential of the first electrode is higher than that of the second electrode.

In the above structure, the second organic compound is preferably an arylamine derivative or a carbazole derivative.

Another feature of the present invention is a light-emitting element which includes a light-emitting layer between a first electrode and a second electrode, where the light-emitting layer includes a first layer and a second layer; the first layer contains a first organic compound and a third organic compound; the second layer contains a second organic compound and the third organic compound; the first layer is provided to be in contact with the second layer on the first electrode side; the first organic compound is an organic compound with an electron transporting property; the second organic compound is an organic compound with a bipolar property; the third organic compound has an electron trapping property; and light emission from the third organic compound can be obtained when voltage is applied to the first electrode and the second electrode so that the potential of the first electrode is higher than that of the second electrode.

Another feature of the present invention is a light-emitting element which includes a light-emitting layer between a first electrode and a second electrode, where the light-emitting layer includes a first layer and a second layer; the first layer contains a first organic compound and a third organic compound; the second layer contains a second organic compound and the third organic compound; the first layer is provided to be in contact with the second layer on the first electrode side; the first organic compound is an organic compound with an electron transporting property; the second organic compound is an organic compound with a bipolar property; the lowest unoccupied molecular orbital level (LUMO level) of the third organic compound is lower than that of the second organic compound by greater than or equal to 0.3 eV; light emission from the third organic compound can be obtained when voltage is applied to the first electrode and the second electrode so that and the potential of the first electrode is higher than that of the second electrode.

Another feature of the present invention is a light-emitting element which includes an electron transporting layer and a hole transporting layer between a first electrode and a second electrode; and a first layer and a second layer between the electron transporting layer and the hole transporting layer, where the first layer contains a first organic compound and a third organic compound; the second layer contains a second organic compound and the third organic compound; the first layer is provided to be in contact with the second layer on the first electrode side; the first organic compound is an organic compound with an electron transporting property; the second organic compound is an organic compound with a bipolar property; the third organic compound has an electron trapping property; and light emission from the third organic compound can be obtained when voltage is applied to the first electrode and the second electrode so that the potential of the first electrode is higher than that of the second electrode.

Another feature of the present invention is a light-emitting element which includes an electron transporting layer and a hole transporting layer between a first electrode and a second electrode; and a first layer and a second layer between the electron transporting layer and the hole transporting layer, where the first layer contains a first organic compound and a third organic compound; the second layer contains a second organic compound and the third organic compound; the first layer is provided to be in contact with the second layer on the first electrode side; the first organic compound is an organic compound with an electron transporting property; the second organic compound is an organic compound with a bipolar property; the lowest unoccupied molecular orbital level (LUMO level) of the third organic compound is lower than that of the second organic compound by greater than or equal to 0.3 eV; and light emission from the third organic compound can be obtained when voltage is applied to the first electrode and the second electrode so that the potential of the first electrode is higher than that of the second electrode.

In the above structure, the second organic compound preferably has an arylamine skeleton and a quinoxaline skeleton.

In the above structure, the thickness of the first layer is preferably the same as that of the second layer, or thinner than that of the second layer.

In the above structure, the third organic compound preferably has an electron-withdrawing group.

In the above structure, the third organic compound is preferably a substance which emits phosphorescence.

In the above structure, the third organic compound is preferably a metal complex which has a pyrazine skeleton or a quinoxaline skeleton and has a metal atom of Group 9 or Group 10 of the periodic table. In particular, the metal atom is preferably iridium (Ir) or platinum (Pt) because iridium (Ir) or platinum (Pt) can efficiently emit phosphorescence by a heavy atom effect.

In the above structure, the third organic compound preferably has a structure represented by a general formula (1).

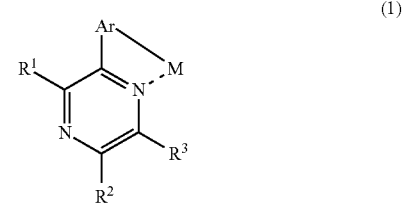

(1)

(In the formula, Ar represents an aryl group, each of $R^1$ to $R^3$ represents hydrogen, an alkyl group, or an aryl group, and $R^2$ and $R^3$ may be bonded to each other to form a ring. M represents either an element belonging to Group 9 or an element belonging to Group 10.)

In the above structure, the third organic compound preferably has a structure represented by a general formula (2).

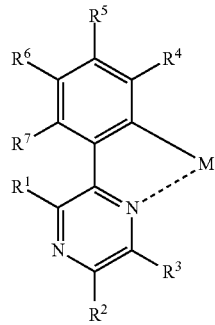

(2)

(In the formula, each of $R^1$ to $R^3$ represents hydrogen, an alkyl group, or a phenyl group, and $R^2$ and $R^3$ may be bonded to each other to form a ring. Each of $R^4$ to $R^7$ represents hydrogen, a halogen group, an alkyl group, or a haloalkyl group. M represents either an element belonging to Group 9 or an element belonging to Group 10.)

In the above structure, the third organic compound is preferably an organic compound represented by a general formula (3).

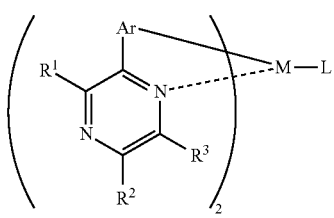

(3)

(In the formula, Ar represents an aryl group, each of $R^1$ to $R^3$ represents hydrogen, an alkyl group, or an aryl group, and $R^2$ and $R^3$ may be bonded to each other to form a ring. M is a central metal and represents either an element belonging to Group 9 or an element belonging to Group 10. L represents a monoanionic ligand. When the central metal is an element belonging to Group 9, n is 2, and when the central metal is an element belonging to Group 10, n is 1.)

In the above structure, the third organic compound is preferably an organic compound represented by a general formula (4).

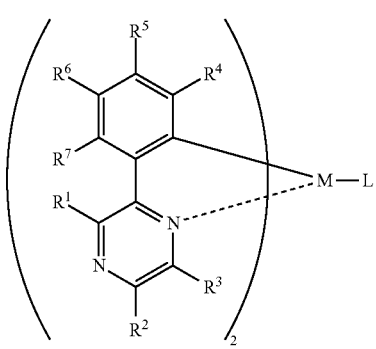

(4)

(In the formula, each of $R^1$ to $R^3$ represents hydrogen, an alkyl group, or a phenyl group, and $R^2$ and $R^3$ may be bonded to each other to form a ring. Each of $R^4$ to $R^7$ represents hydrogen, a halogen group, an alkyl group, or a haloalkyl group. M is a central metal and represents either an element belonging to Group 9 or an element belonging to Group 10. L represents a monoanionic ligand. When the central metal is an element belonging to Group 9, n is 2, and when the central metal is an element belonging to Group 10, n is 1.)

In the above structure, the monoanionic ligand is preferably any of a monoanionic bidentate chelate ligand having a beta-diketone structure, a monoanionic bidentate chelate ligand having a carboxyl group, a monoanionic bidentate chelate ligand having a phenolic hydroxyl group, and a monoanionic bidentate chelate ligand in which two ligand elements are both nitrogen.

In the above structure, the monoanionic ligand is preferably monoanionic ligands represented by the following structural formulas (L1) to (L8).

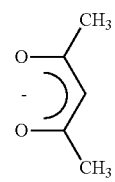

(L1)

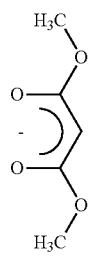

(L2)

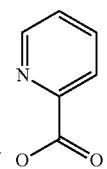

(L3)

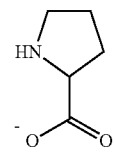

(L4)

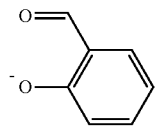

(L5)

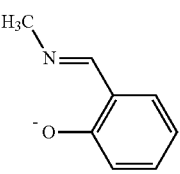

(L6)

-continued

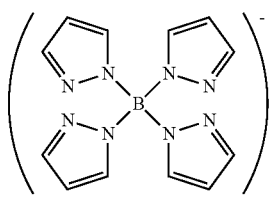

(L7)

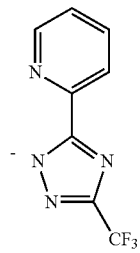

(L8)

In the above structure, M is preferably iridium (Ir) or platinum (Pt) because iridium (Ir) or platinum (Pt) can efficiently emit phosphorescence by a heavy atom effect.

In the above structure, the ionization potential of the first organic compound is preferably less than or equal to 6.0 eV.

In the above structure, the first organic compound is preferably a metal complex.

In the above structure, the thickness of the first layer is preferably greater than or equal to 5 nm and less than or equal to 30 nm.

In the above structure, the thickness of the second layer is preferably greater than or equal to 5 nm and less than or equal to 30 nm.

The present invention includes a light-emitting device having the above-described light-emitting element in its category. The light-emitting device in this specification refers to an image display device, a light-emitting device, or a light source (also refers to a lighting system). In addition, the light-emitting element also refers to the following: a module in which a connector, for example, an FPC (flexible printed circuit), a TAB (tape automated bonding) tape, or a TCP (tape carrier package), is attached to a panel including a light-emitting element; a module in which a printed circuit board is provided at an end of a TAB tape or a TCP; and a module in which an IC (integrated circuit) is directly mounted on a light-emitting element by a COG (chip on glass) method.

The present invention also includes an electronic appliance in which the light-emitting element of the present invention is used for a display portion in its category. Thus, an electronic appliance of the present invention has a feature of having a display portion which is provided with the above-described light-emitting element and a control unit for controlling light emission of the light-emitting element.

The light-emitting element of the present invention has good carrier balance and high recombination probability of carriers. Thus, a light-emitting element with high light emission efficiency can be obtained. In addition, since the light-emitting element has good carrier balance, a light-emitting element with a long lifetime can be obtained. Moreover, a light-emitting element with high light emission efficiency and a long lifetime can be obtained.

When the light-emitting element of the present invention is applied to a light-emitting device and an electronic appliance, a light-emitting device and an electronic appliance each having high light emission efficiency can be obtained. In addition, a light-emitting device and an electronic appliance each having a long lifetime can be obtained.

BRIEF DESCRIPTION OF THE DRAWINGS

In the accompanying drawings:

FIGS. 5A and 5B are diagrams explaining a light-emitting device of the present invention;

DETAILED DESCRIPTION OF THE INVENTION

Embodiment Mode

Figure 1A:
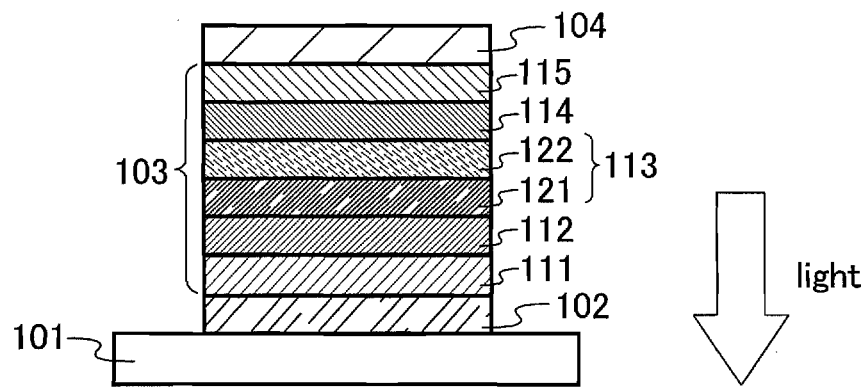
FIGS. 1A to 1C are diagrams explaining a light-emitting element of the present invention.

Embodiment Modes of the present invention will be hereinafter explained in detail with reference to the drawings. However, the present invention is not limited to the following explanation, and it is easily understood by those skilled in the art that modes and details of the present invention can be modified in various ways without departing from the spirit and scope of the present invention. Therefore, the present invention should not be interpreted as being limited to the following description of Embodiment Modes.

Note that in this specification, the term "composite" means a state in which charges can be transferred between materials by not only simple mixture of two materials but also by mixture of a plurality of materials.

[Embodiment Mode 1]

One mode of a light-emitting element of the present invention will be explained with reference to FIG. 1A.

The light-emitting element of the present invention includes a plurality of layers between a pair of electrodes. The plurality of layers is stacked in combination of a layer formed of a substance with a high carrier injecting property and a layer formed of a substance with a high carrier transporting property so that a light-emitting region is formed in a portion away from the electrodes, in other words, so that carriers are recombined in a portion away from the electrodes.

In this embodiment mode, a light-emitting element includes a first electrode 102, a second electrode 104, and an EL layer 103 provided between the first electrode 102 and the second electrode 104. Note that in this embodiment mode, explanation is made on the assumption that the first electrode 102 functions as an anode and the second electrode 104 functions as a cathode. That is, the explanation is made on the assumption that light emission can be obtained when voltage is applied to the first electrode 102 and the second electrode 104 so that the potential of the first electrode 102 is higher than that of the second electrode 104.

The substrate 101 is used as a support of the light-emitting element. For example, glass, plastic, or the like can be used for the substrate 101. Note that other materials may also be used as long as they function as a support in a manufacturing process of the light-emitting element.

The first electrode 102 is preferably formed of a metal, an alloy, a conductive compound, a mixture thereof, or the like having a high work function (specifically, a work function of greater than or equal to 4.0 eV). Specifically, for example, indium tin oxide (ITO), indium tin oxide containing silicon or silicon oxide, indium zinc oxide (IZO), indium oxide containing tungsten oxide and zinc oxide (IWZO), and the like are given. Although such conductive metal oxide films are generally formed by sputtering, they may also be formed by a sol-gel method. For example, indium zinc oxide (IZO) can be formed by sputtering using a target in which 1 to 20 wt % of zinc oxide is added to indium oxide. In addition, indium oxide containing tungsten oxide and zinc oxide (IWZO) can be formed by sputtering using a target in which 0.5 to 5 wt % of tungsten oxide and 0.1 to 1 wt % of zinc oxide are added to indium oxide. Other than these, gold (Au), platinum (Pt), nickel (Ni), tungsten (W), chromium (Cr), molybdenum (Mo), iron (Fe), cobalt (Co), copper (Cu), palladium (Pd), a nitride of a metal material (e.g., titanium nitride), and the like are given.

The EL layer 103 described in this embodiment mode includes a hole injecting layer 111, a hole transporting layer 112, a light-emitting layer 113, an electron transporting layer 114, and an electron injecting layer 115. Note that the EL layer 103 is acceptable as long as it has the light-emitting layer described in this embodiment mode, and a stacked structure of layers other than the light-emitting layer 113 is not particularly limited. That is, there is no particular limitation on a stacked structure of the EL layer 103. The EL layer 103 may be formed in an appropriate combination of the light-emitting layer described in this embodiment mode and layers containing a substance with a high electron transporting property, a substance with a high hole transporting property, a substance with a high electron injecting property, a substance with a high hole injecting property, a substance with a bipolar property (a substance with high electron and hole transporting properties), and the like. For example, the EL layer 103 can be formed in an appropriate combination of a hole injecting layer, a hole transporting layer, a light-emitting layer, an electron transporting layer, an electron injecting layer, and the like. A material forming each layer is specifically described below.

The hole injecting layer 111 is a layer containing a substance with a high hole injecting property. As the substance with a high hole injecting property, the following can be used: molybdenum oxide, vanadium oxide, ruthenium oxide, tungsten oxide, manganese oxide, and the like. The hole injecting layer 111 can also be formed of a phthalocyanine-based compound such as phthalocyanine (abbreviation: H$_2$Pc) and copper phthalocyanine (CuPc), a polymer such as poly(3,4-ethylenedioxythiophene)/poly(styrene sulfonate) (PEDOT/PSS), or the like.

Alternatively, the hole injecting layer 111 can be formed using a composite material in which a substance with an acceptor property is mixed into a substance with a high hole transporting property. Note that when the composite material in which a substance with an acceptor property is mixed into a substance with a high hole transporting property is used, a material for forming an electrode can be selected regardless of work function of the electrode. That is, besides a material with a high work function, a material with a low work function may also be used for the first electrode 102. As the substance with an acceptor property, 7,7,8,8-tetracyano-2,3,5,6-tetrafluoroquinodimethane (abbreviation: F$_4$-TCNQ), chloranil, and the like can be given. In addition, transition metal oxide can be given. Moreover, an oxide of a metal belonging to Groups 4 to 8 of the periodic table can also be given. In particular, it is preferable to use vanadium oxide, niobium oxide, tantalum oxide, chromium oxide, molybdenum oxide, tungsten oxide, manganese oxide, and rhenium oxide because they have high electron accepting properties. Above all, molybdenum oxide is particularly preferable because it is stable even in the atmospheric air, has a low hygroscopic property, and is easy to be handled.

As an organic compound used for the composite material, various compounds such as aromatic amine compounds, carbazole derivatives, aromatic hydrocarbons, and high molecular compounds (e.g., oligomer, dendrimer, or polymer) can be used. The organic compound used for the composite material is preferably an organic compound with a high hole transporting property. Specifically, a compound with a hole mobility of greater than or equal to $10^{-6}$ cm$^2$/Vs is preferably used. However, other compounds may also be used as long as the hole transporting properties thereof are higher than the electron transporting properties thereof. Specific organic compounds that can be used for the composite material are given below.

As the aromatic amine compound, the following can be given, for example: N,N'-di(p-tolyl)-N,N'-diphenyl-p-phenylenediamine (abbreviation: DTDPPA); 4,4'-bis[N-(4-diphenylaminophenyl)-N-phenylamino]biphenyl (abbreviation: DPAB); 4,4'-bis(N-{4-[N'-(3-methylphenyl)-N'-phenylamino]phenyl}-N-phenylamino)biphenyl (abbreviation: DNTPD); 1,3,5-tris[N-(4-diphenylaminophenyl)-N-phenylamino]benzene (abbreviation: DPA3B); and the like.

As the carbazole derivative that can be used for the composite material, the following can be specifically given: 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); and the like.

In addition, the following can be used: 4,4'-di(N-carbazolyl)biphenyl (abbreviation: CBP); 1,3,5-tris[4-(N-carbazolyl)phenyl]benzene (abbreviation: TCPB); 9-[4-(10-phenyl-9-anthryl)phenyl]-9H-carbazole (abbreviation: CzPA); 1,4-bis[4-(N-carbazolyl)phenyl]-2,3,5,6-tetraphenylbenzene; and the like can be used.

As the aromatic hydrocarbon that can be used for the composite material, the following can be given, for example: 2-tert-butyl-9,10-di(2-naphthyl)anthracene (abbreviation: t-BuDNA); 2-tert-butyl-9,10-di(1-naphthyl)anthracene; 9,10-bis(3,5-diphenylphenyl)anthracene (abbreviation: DPPA); 2-tert-butyl-9,10-dis(4-phenylphenyl)anthracene (abbreviation: t-BuDBA); 9,10-di(2-naphthyl)anthracene (abbreviation: DNA); 9,10-diphenylanthracene (abbreviation: DPAnth); 2-tert-butylanthracene (abbreviation: t-BuAnth); 9,10-bis(4-methyl-1-naphthyl)anthracene (abbreviation: DMNA); 9,10-bis[2-(1-naphthyl)phenyl]-2-tert-butylanthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; and the like. In addition to these, pentacene, coronene, and the like can also be used. As described above, it is more preferable to use aromatic hydrocarbon which has a hole mobility of greater than or equal to $1\times10^{-6}$ cm$^2$/Vs and has 14 to 42 carbon atoms.

The aromatic hydrocarbon that can be used for the composite material may have a vinyl skeleton. As the aromatic hydrocarbon having a vinyl group, the following are given for example: 4,4'-bis(2,2-diphenylvinyl)biphenyl (abbreviation: DPVBi); 9,10-bis[4-(2,2-diphenylvinyl)phenyl]anthracene (abbreviation: DPVPA); and the like.

In addition, a high molecular compound such as poly(N-vinylcarbazole) (abbreviation: PVK) or poly(4-vinyl triphenylamine) (abbreviation: PVTPA) can also be used.

The hole transporting layer 112 is a layer containing a substance with a high hole transporting property. As the substance with a high hole transporting property, aromatic amine compounds such as 4,4'-bis[N-(1-naphthyl)-N-phenylamino] biphenyl (abbreviation: NPB or α-NPD), N,N'-bis(3-methylphenyl)-N,N'-diphenyl-[1,1'-biphenyl]-4,4'-diamine (abbreviation: TPD), 4,4',4''-tris(N,N-diphenylamino) triphenylamine (abbreviation: TDATA), 4,4',4''-tris[N-(3-methylphenyl)-N-phenylamino]triphenylamine (abbreviation: MTDATA), and N,N'-bis(spiro-9,9'-bifluorene-2-yl)-N,N'-diphenylbenzidine (abbreviation: BSPB) can be used. The substances described here are mainly substances which have hole mobility of greater than or equal to $10^{-6}$ cm$^2$/Vs. However, other substances may also be used as long as the hole transporting properties thereof are higher than the electron transporting properties thereof. Note that the layer containing a substance with a high hole transporting property is not limited to a single layer but may have a stacked structure of two or more layers formed of the above-described substances.

The light-emitting layer 113 is a layer containing a substance with a high light-emitting property. In the light-emitting element of the present invention, the light-emitting layer includes a first layer 121 and a second layer 122. The first layer 121 contains a first organic compound and a third organic compound. The second layer 122 contains a second organic compound and the third organic compound. The first layer 121 is provided to be in contact with the second layer 122 on the first electrode side, that is, on the anode side.

The first organic compound contained in the first layer 121 is a substance with an electron transporting property, in which an electron transporting property is higher than a hole transporting property. As the first organic compound, a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$); or bis(2-methyl-8-quinolinolato)(4-phenylphenolato)aluminum (abbreviation: BAlq); or the like can be used. In addition to these, a metal complex having an oxazole-based or thiazole-based ligand, such as bis[2-(2-hydroxyphenyl)-benzoxazolato]zinc (abbreviation: Zn(BOX)$_2$) or bis[2-(2-hydroxyphenyl)-benzothiazolate]zinc (abbreviation: Zn(BTZ)$_2$); or the like can be also used. Furthermore, besides the metal complex, the following can be used: 2-(4-biphenylyl)-5-(4-tert-butylphenyl)-1,3,4-oxadiazole (abbreviation: PBD); 1,3-bis[5-(p-tert-butylphenyl)-1,3,4-oxadiazole-2-yl]benzene (abbreviation: OXD-7); 3-(4-biphenylyl)-4-phenyl-5-(4-tert-butylphenyl)-1,2,4-triazole (abbreviation: TAZ); bathophenanthroline (abbreviation: BPhen); bathocuproin (abbreviation: BCP); and the like.

The first organic compound is preferably a substance into which holes are injected. That is, the ionization potential of the first organic compound is preferably less than or equal to 6.0 eV. If the first organic compound is a compound into which holes are injected, driving voltage is prevented from being very high, so that the effect of the present invention can be obtained. Of the above-described materials, the metal complexes such as Alq (ionization potential: 5.65 eV), BAlq (ionization potential: 5.70 eV), Zn(BOX)$_2$ (ionization potential: 5.62 eV), and Zn(BTZ)$_2$ (ionization potential: 5.49 eV) have ionization potential of less than or equal to 6.0 eV and holes are comparatively easily injected although they have electron transporting properties; thus, these metal complexes are preferable as the first organic compound.

The second organic compound contained in the second layer 122 is a substance with a hole transporting property. Specifically, the second organic compound is a substance in which a hole transporting property is higher than an electron transporting property, a so-called substance with a hole transporting property, or a substance with a bipolar property which has both an electron transporting property and a hole transporting property. That is, it is acceptable as long as the second organic compound is a substance with a hole transporting property.

As the substance with a hole transporting property, arylamine derivatives or carbazole derivatives can be given. Specifically, as the arylamine derivatives, the following can be given: 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), N,N'-bis(spiro-9,9'-bifluorene-2-yl)-N,N'-diphenylbenzidine (abbreviation: BSPB), and the like. In addition, the following can be given: N,N'-bis(4-methylphenyl)(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), and the like. As the carbazole derivatives, the following can be given: 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 1,4-bis[4-(N-carbazolyl)phenyl]-2,3,5,6-tetraphenylbenzene, and the like.

As the substance with a bipolar property, a substance having an arylamine skeleton and a quinoxaline skeleton in the same molecule can be given. Specifically, the following can be given: 2,3-bis(4-diphenylaminophenyl)quinoxaline (abbreviation: TPAQn), 2,3-bis{4-[N-(4-biphenyl)-N-phenylamino]phenyl}quinoxaline (abbreviation: BPAPQ), 2,3-bis{4-[N,N-di(4-biphenylyl)amino]phenyl}quinoxaline (abbreviation: BBAPQ), 4,4'-(quinoxaline-2,3-diyl)bis{N-[4-(9-carbazolyl)phenyl]-N-phenylbenzeneamine} (abbreviation: YGAPQ), N,N'-(quinoxaline-2,3-diyldi-4,1-phenylene)bis(N-phenyl-9-phenylcarbazole-3-amine) (abbreviation: PCAPQ), and the like.

The second organic compound preferably has a certain amount of electron transporting property because the third organic compound with an electron trapping property is added thereto. Therefore, the second organic compound is preferably an organic compound with a bipolar property.

In the case where a substance with a bipolar property is used as the second organic compound, the first layer 121 is preferably as thick as the second layer 122, or thinner than the second layer 122. A substance with a bipolar property is contained in the second layer 122, so that increase in driving voltage can be suppressed even if the second layer 122 is made thicker than the first layer 121.

The third organic compound contained in the first layer 121 and the second layer 122 is a substance with a high light-emitting property. Various materials can be used for the third organic compound. In particular, the third organic compound is preferably a substance with an electron trapping property. When the third organic compound is a substance with a high electron trapping property, more profound effect can be obtained by application of the present invention, which is preferable. Thus, the lowest unoccupied molecular orbital level (LUMO level) of the third organic compound is preferably lower than that of the second organic compound by greater than or equal to 0.3 eV. A substance with an electron-withdrawing group is preferable because the lowest unoccupied molecular orbital level (LUMO level) thereof tends to be lowered. As the electron-withdrawing group, a halogen group such as a fluoro group; a cyano group; a haloalkyl group such as a trifluoromethyl group; a carbonyl group; and the like are given.

Specifically, as a substance which emits light (fluorescence) from a singlet excited state, the following can be given: a substance which exhibits light emission of blue to blue green, such as acridone, coumarin 102, coumarin 6H, coumarin 480D, or coumarin 30; a substance which exhibits light emission of blue green to yellow green, such as N,N'-dimethylquinacridone (abbreviation: DMQd), N,N'-diphenylquinacridone (abbreviation: DPQd), 9,18-dihydro-benzo[h]benzo[7,8]quino[2,3-b]acridine-7,16-dione (abbreviation: DMNQd-1), 9,18-dimethyl-9,18-dihydro-benzo[h]benzo[7,8]quino[2,3-b]acridine-7,16-dione (abbreviation: DMNQd-2), coumarin 30, coumarin 6, coumarin 545T, or coumarin 153; a substance which exhibits light emission of yellow green to yellow orange, such as DMQd or (2-{2-[4-(9H-carbazol-9-yl)phenyl]ethenyl}-6-methyl-4H-pyran-4-ylidene)propanedinitrile (abbreviation: DCMCz); a substance which exhibits light emission of orange to red, such as (2-{2-[4-(dimethylamino)phenyl]ethenyl}-6-methyl-4H-pyran-4-ylidene)propanedinitrile (abbreviation: DCM1), {2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), {2-(1,1-dimethylethyl)-6-[2-(2,3,6,7-tetrahydro-1,1,7,7-tetramethyl-1H,5H-benzo[ij]quinolizin-9-yl)ethenyl]-4H-pyran-4-ylidene}propanedinitrile (abbreviation: DCJTB), or Nile red; or the like. As a substance which emits light (phosphorescence) from a triplet excited state, the following can be given: bis[2-(4',6'-difluorophenyl)pyridinato-N,C$^{2'}$]iridium(III)tetrakis(1-pyrazolyl)borate (abbreviation: FIr6), bis[2-(4',6'-difluorophenyl)pyridinato-N,C$^{2'}$]iridium(III)picolinate (abbreviation: FIrpic), bis[2-(3',5'-bistrifluoromethyl-phenyl)-pyridinato-N,C$^{2'}$]iridium(III)picolinate (abbreviation: Ir(CF$_3$ppy)$_2$(pic)), bis[2-(4',6'-difluorophenyl)pyridinato-N,C$^{2'}$]iridium(III) acetylacetonate (abbreviation: FIracac), or the like. In particular, a substance which emits phosphorescence from a triplet excited state is preferable because it has high light emission efficiency.

In addition, it is preferable that the third organic compound be a metal complex which has a pyrazine skeleton or a quinoxaline skeleton and have a metal atom of Group 9 or Group 10 of the periodic table. The metal complex having such a structure is preferable because it emits phosphorescence from a triplet excited state. In particular, the metal atom is preferably iridium (Ir) or platinum (Pt) because iridium (Ir) or platinum (Pt) can efficiently emit phosphorescence by a heavy atom effect.

Specifically, an organic compound having a structure represented by a general formula (1) can be given as the third organic compound.

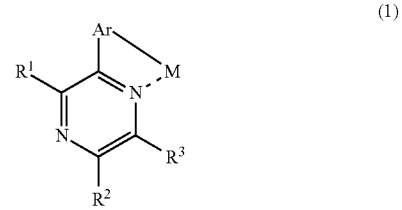

(1)

(In the formula, Ar represents an aryl group, each of R$^1$ to R$^3$ represents hydrogen, an alkyl group, or an aryl group, and R$^2$ and R$^3$ may be bonded to each other to form a ring. The ring may be an alicyclic ring or a condensed ring. M represents either an element belonging to group 9 or an element belonging to Group 10.)

In addition, an organic compound having a structure represented by a general formula (2) can be given as the third organic compound.

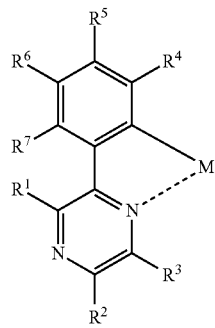

(2)

(In the formula, each of $R^1$ to $R^3$ represents hydrogen, an alkyl group, or a phenyl group, and $R^2$ and $R^3$ may be bonded to each other to form a ring. The ring may be an alicyclic ring or a condensed ring. Each of $R^4$ to $R^7$ represents hydrogen, a halogen group, an alkyl group, or a haloalkyl group. M represents either an element belonging to Group 9 or an element belonging to Group 10.)

More specifically, the third organic compound is preferably an organic compound represented by a general formula (3).

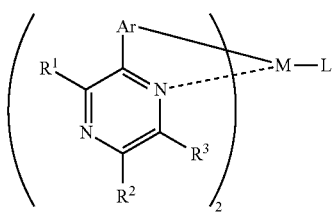

(3)

(In the formula, Ar represents an aryl group, each of $R^1$ to $R^3$ represents hydrogen, an alkyl group, or an aryl group, and $R^2$ and $R^3$ may be bonded to each other to form a ring. The ring may be an alicyclic ring or a condensed ring. M is a central metal and represents either an element belonging to Group 9 or an element belonging to Group 10. L represents a monoanionic ligand. When the central metal is an element belonging to Group 9, n is 2, and when the central metal is an element belonging to Group 10, n is 1.)

In addition, the third organic compound is preferably an organic compound represented by a general formula (4).

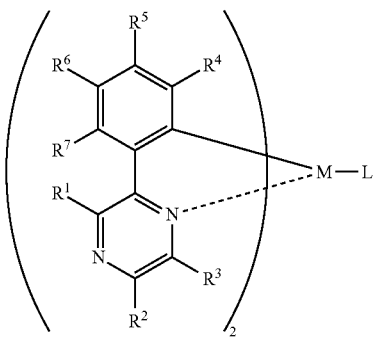

(4)

(In the formula, each of $R^1$ to $R^3$ represents hydrogen, an alkyl group, or a phenyl group, and $R^2$ and $R^3$ may be bonded to each other to form a ring. The ring may be an alicyclic ring or a condensed ring. Each of $R^4$ to $R^7$ represents hydrogen, a halogen group, an alkyl group, or a haloalkyl group. M is a central metal and represents either an element belonging to Group 9 or an element belonging to Group 10. L represents a monoanionic ligand. When the central metal is an element belonging to Group 9, n is 2, and when the central metal is an element belonging to Group 10, n is 1.)

Note that the monoanionic ligand L in each of the general formulas (3) and (4) is preferably either one of the following because of high coordinating ability: a monoanionic bidentate chelate ligand having a beta-diketone structure, a monoanionic bidentate chelate ligand having a carboxyl group, a monoanionic bidentate chelate ligand having a phenolic hydroxyl group, and a monoanionic bidentate chelate ligand in which two ligand elements are both nitrogen. More preferably, the monoanionic ligand L is monoanionic ligands represented by the following structural formulas (L1) to (L8). These ligands are useful because they have high coordinating ability and are available at a low price.

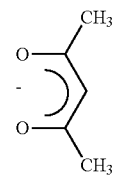

(L1)

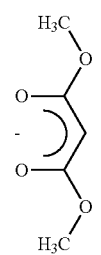

(L2)

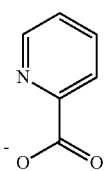

(L3)

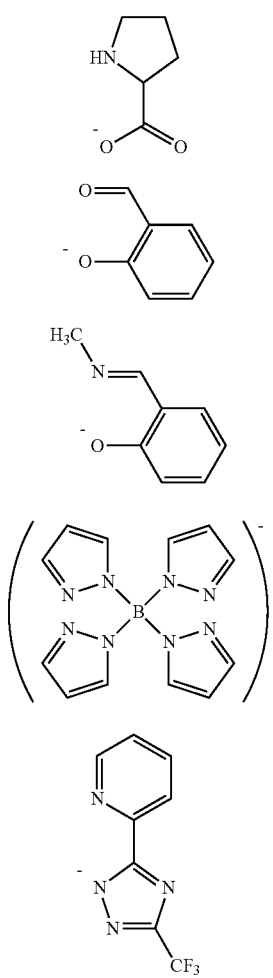

(L4)

(L5)

(L6)

(L7)

(L8)

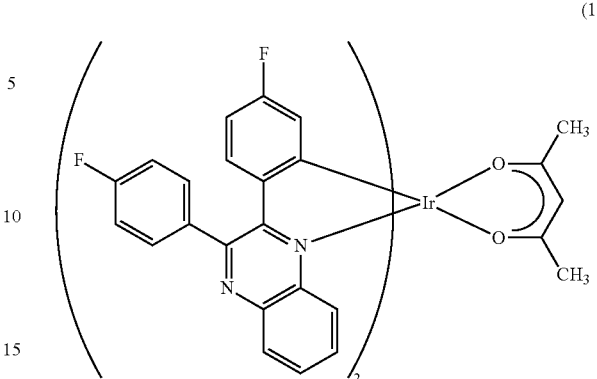

(12)

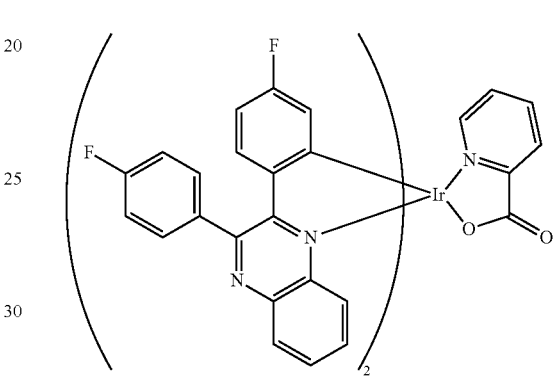

(13)

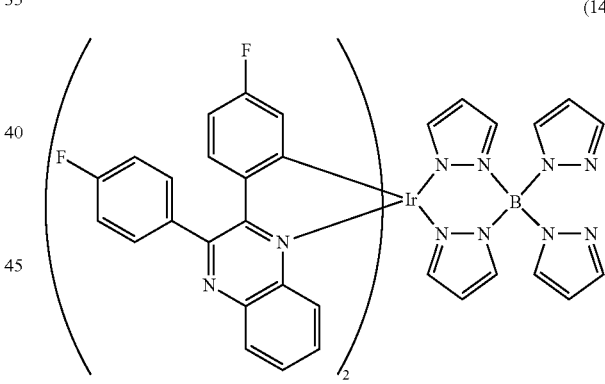

(14)

For more efficient emission of phosphorescence, a heavy metal is preferable as a central metal in terms of a heavy atom effect. Thus, the central metal M is preferably iridium or platinum in the above-described organometallic complex of the present invention. When the central metal M is iridium, the heat resistance of the organometallic complex is improved; thus, iridium is particularly preferable for the central metal M.

Specifically, organic compounds represented by general formulas (11) to (38) are given as the organic compounds represented by the general formulas (3) and (4).

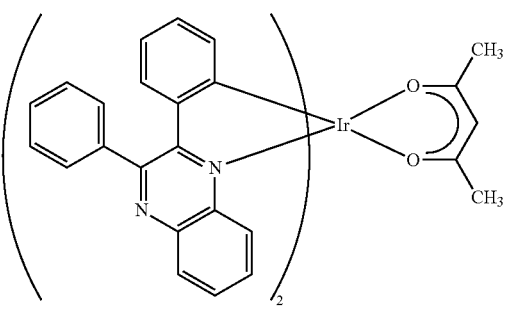

(11)

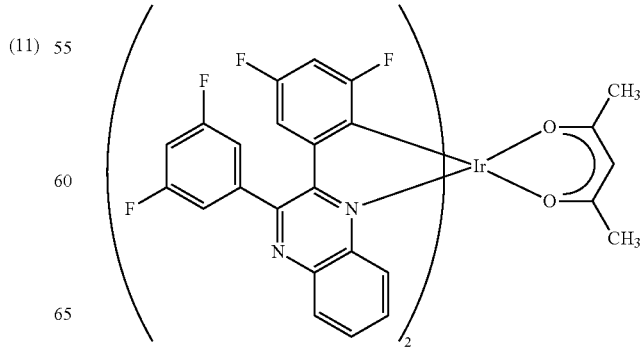

(15)

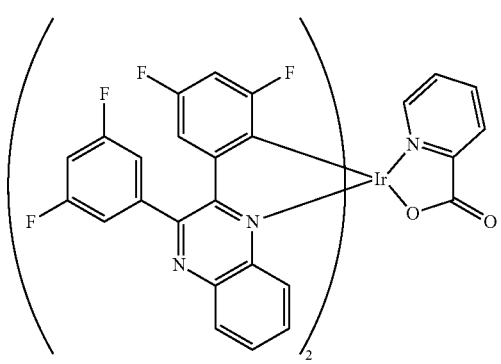
(16)
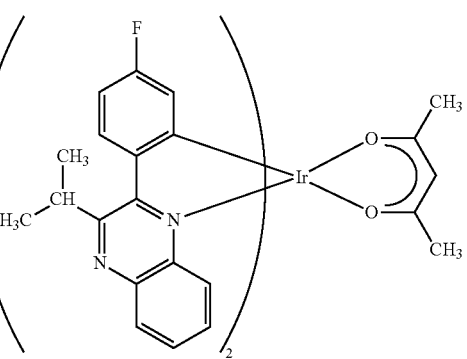
(20)
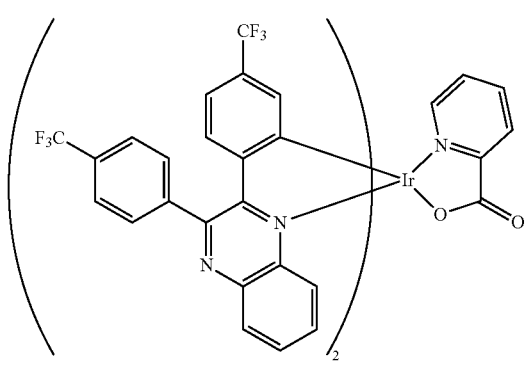
(17)
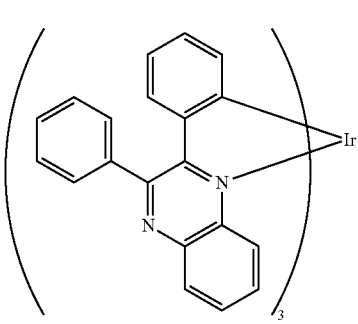
(21)
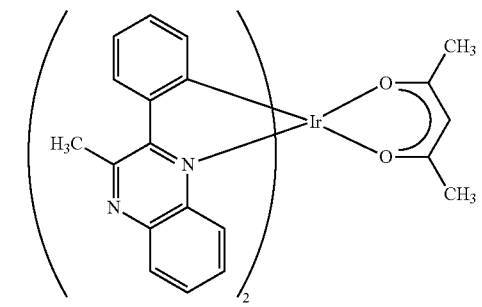
(18)
(22)
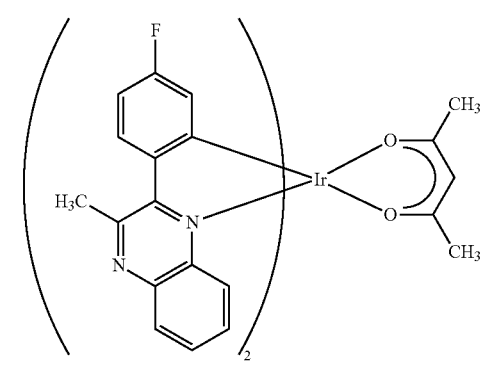
(19)
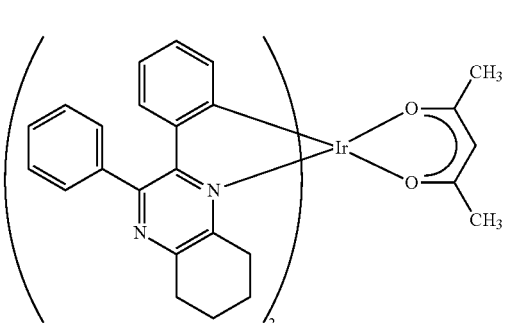
(23)

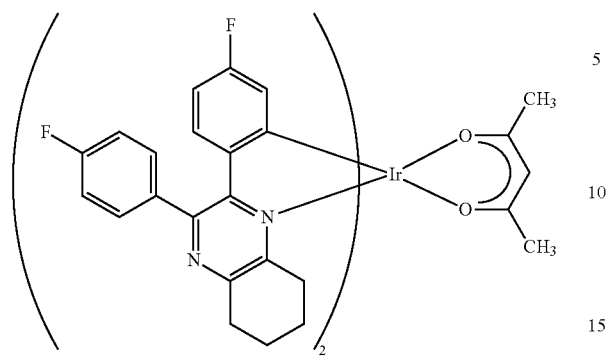
(24)
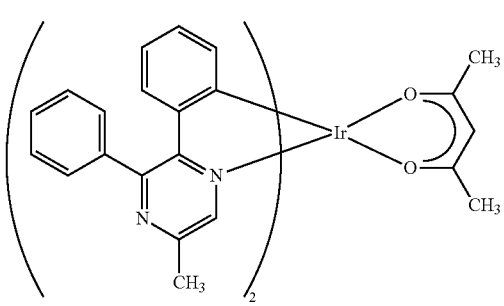
(28)
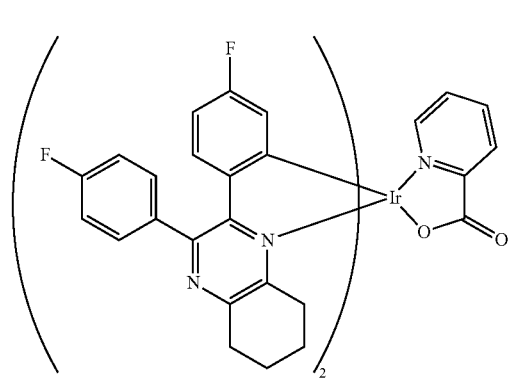
(25)
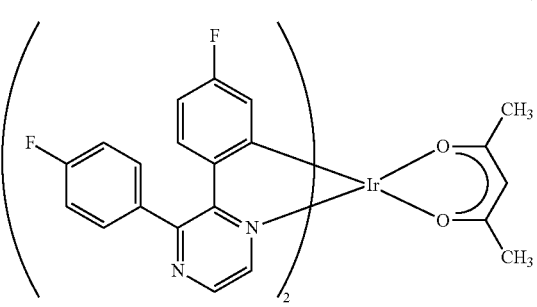
(29)
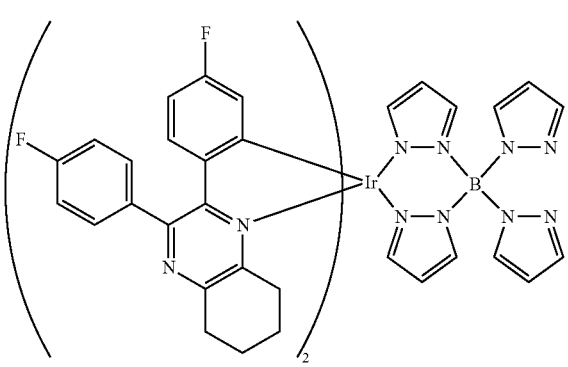
(26)
(30)
(27)
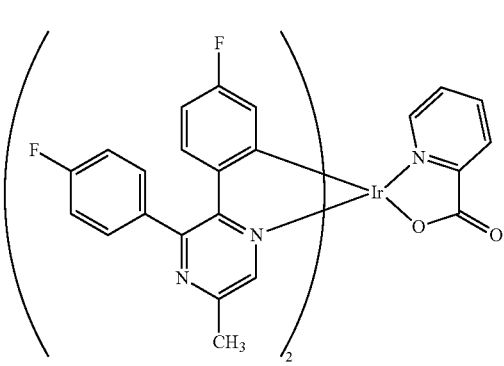
(31)

-continued

(32)
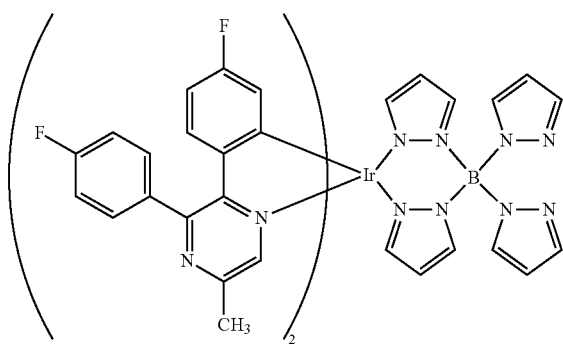

(33)
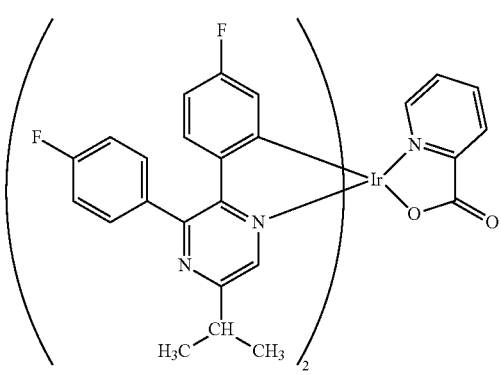

(34)
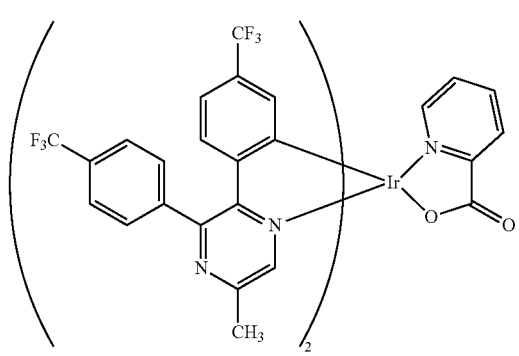

(35)
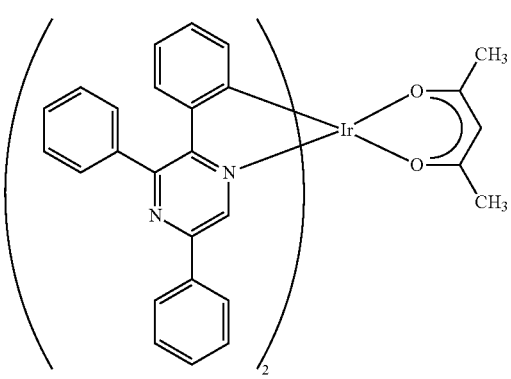

-continued

(36)
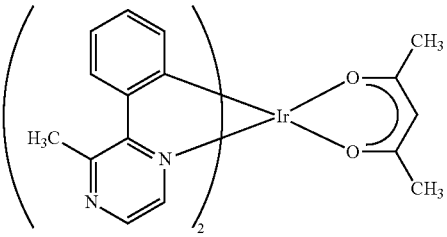

(37)
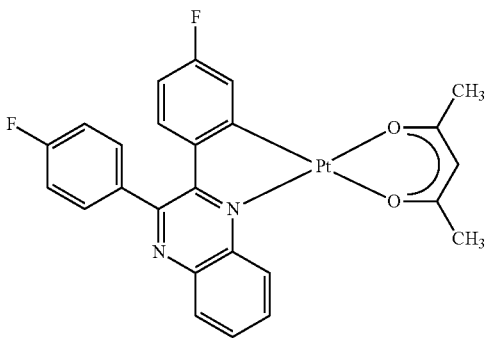

(38)
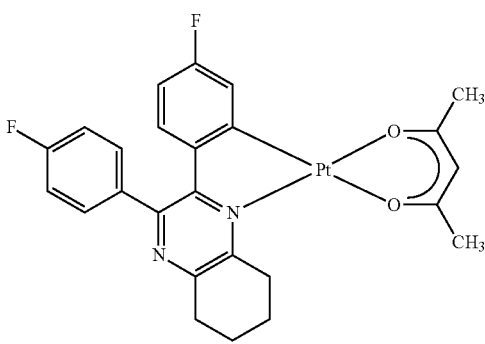

It is preferable that the amount of the first organic compound contained in the first layer 121 be larger than that of the third organic compound. In addition, it is preferable that the amount of the second organic compound contained in the second layer 122 be larger than that of the third organic compound.

Figure 1B:
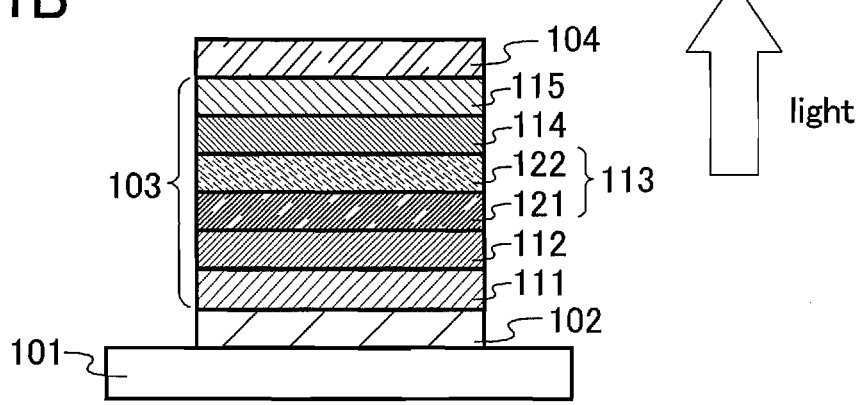
Figure 1C:
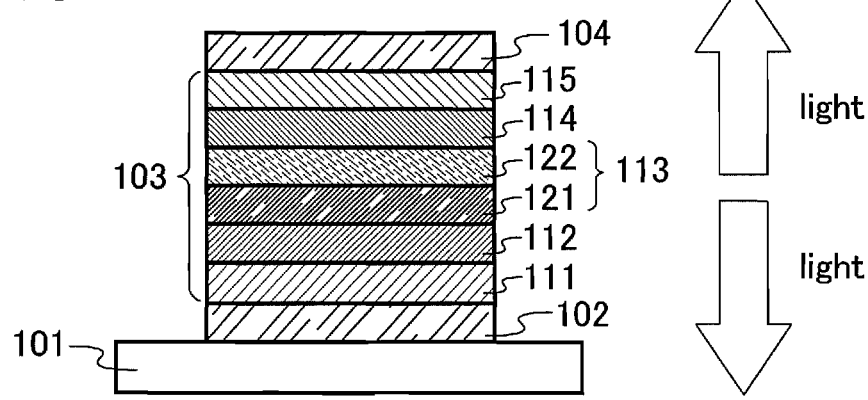
Figure 3:
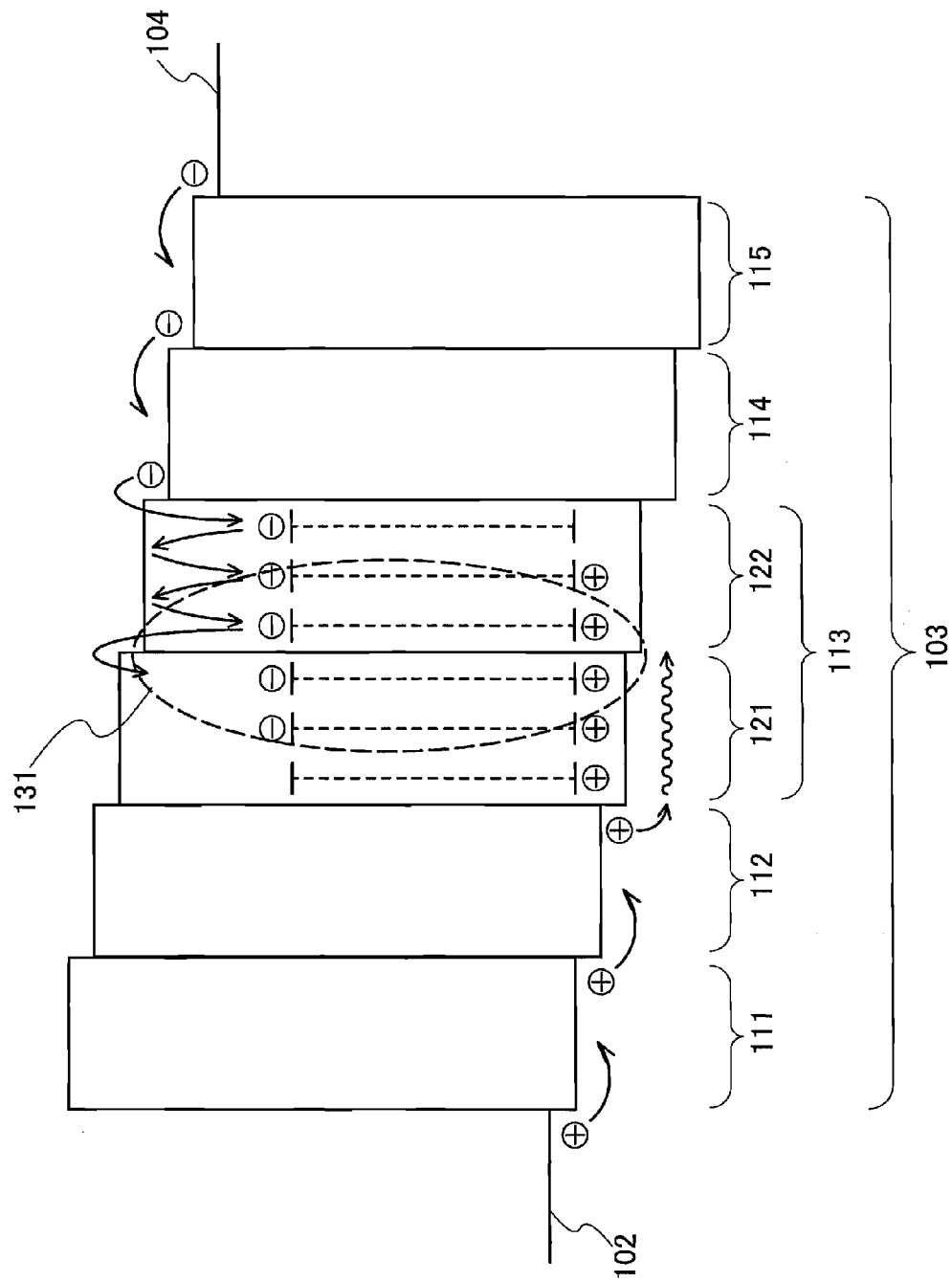
FIG. 3 is a diagram explaining a light-emitting element of the present invention.

Here, FIG. 3 shows an example of a band diagram of the light-emitting element of the present invention shown in FIGS. 1A to 1C. In FIG. 3, electrons injected from the second electrode 104 pass through the electron injecting layer 115 and the electron transporting layer 114 to be injected into the second layer 122. The electrons injected into the second layer 122 are trapped in a substance with a high electron trapping property, so that the speed of the electrons moving through the second layer 122 becomes slow.

On the other hand, holes injected from the first electrode 102 pass through the hole injecting layer 111 and the hole transporting layer 112 to be injected into the first layer 121. The holes injected into the first layer 121 move through the layer in which a large number of first organic compounds with an electron transporting property are contained, so that the moving speed of the holes becomes slow.

Accordingly, carrier balance between the holes and the electrons is improved and a recombination region 131 is formed in the vicinity of an interface between the first layer 121 and the second layer 122. In addition, when the carrier balance is improved, light emission efficiency is increased. Moreover, the life of the light-emitting element is extended.

Since the moving speeds of the holes and electrons become slow, the recombination region 131 is enlarged. Accordingly, exciton density is decreased and T-T annihilation is unlikely to occur even when a substance which emits phosphorescence is used as a substance with a high light-emitting property. In addition, since the recombination region 131 is located in the vicinity of the center of the light-emitting layer, light emission from the hole transporting layer 112 or the electron transporting layer 114 can be suppressed and light emission with good color purity can be obtained. Moreover, the holes can be prevented from reaching the electron transporting layer 114 without recombination or the electrons can be prevented from reaching the hole transporting layer 112 without recombination; thus, deterioration of the hole transporting layer 112 due to the injection of the electrons or deterioration of the electron transporting layer 114 due to the injection of the holes can be suppressed. That is, a light-emitting element with a long lifetime can be obtained.

Figure 27:
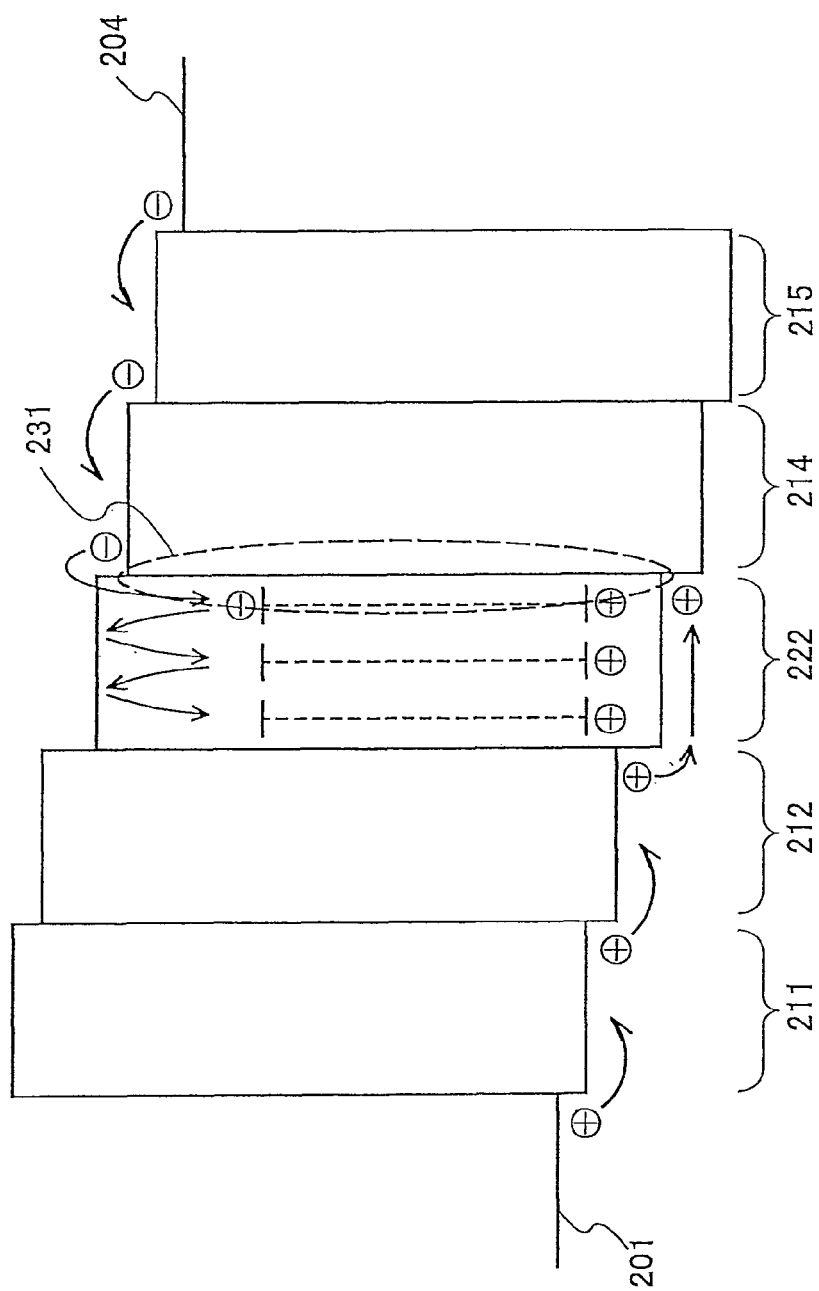
FIG. 27 is a diagram explaining a conventional light-emitting element.

FIG. 27 shows an example of a band diagram of a conventional structure in which a first layer is not provided. Electrons injected from a second electrode 204 pass through an electron injecting layer 215 and an electron transporting layer 214 to be injected into the second layer 222. The electrons injected into the second layer 222 are trapped in a third organic compound with a high electron trapping property, so that the speed of the electrons moving through the second layer 222 becomes slow.

On the other hand, holes injected from the first electrode 201 pass through the hole injecting layer 211 and the hole transporting layer 212 to be injected into the second layer 222. The holes easily move through the second layer 222 because a large number of second organic compounds with a hole transporting property are contained in the second layer 222. Accordingly, the holes reach the vicinity of an interface between the electron transporting layer 214 and the second layer 222 and a recombination region 231 is located in the vicinity of the interface between the second layer 222 and the electron transporting layer 214. In this case, the recombination region 231 is very narrow, so that exciton density is increased. Thus, when a substance which emits phosphorescence is used as a substance with a high light-emitting property, T-T annihilation occurs and light emission efficiency is decreased. In addition, since the recombination region 231 is located in the vicinity of the interface with the electron transporting layer 214, light emission from the electron transporting layer 214 could occur. When the electron transporting layer 214 emits light, desired color cannot be obtained and light emission efficiency of a light-emitting element is decreased. Moreover, since the holes reach the electron transporting layer 214 without recombination, deterioration of the electron transporting layer 214 due to the injection of the holes occurs and the life of the light-emitting element is shortened.

When only the first layer is provided and the second layer is not provided, driving voltage becomes very high. That is, the driving voltage becomes very high if an organic compound which transports holes is not contained in the light-emitting layer.

Note that the thickness of the first layer is preferably greater than or equal to 5 nm and less than or equal to 30 nm. In addition, the thickness of the second layer is preferably greater than or equal to 5 nm and less than or equal to 30 nm. When the thicknesses are within this range, the driving voltage is not increased too much and an effect that carrier balance is improved can be obtained.

The electron transporting layer 114 is a layer containing a substance with a high electron transporting property. For example, the electron transporting layer 114 is formed of a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$); or bis(2-methyl-8-quinolinolato)(4-phenylphenolato)aluminum (abbreviation: BAlq); or the like can be used. In addition to these, a metal complex having an oxazole-based ligand or a thiazole-based ligand, such as bis[2-(2-hydroxyphenyl)benzoxazolato]zinc (abbreviation: Zn(BOX)$_2$) or bis[2-(2-hydroxyphenyl)benzothiazolate]zinc (abbreviation: Zn(BTZ)$_2$); or the like. Furthermore, besides the metal complex, the following can be used: 2-(4-biphenylyl)-5-(4-tert-butylphenyl)-1,3,4-oxadiazole (abbreviation: PBD); 1,3-bis[5-(p-tert-butylphenyl)-1,3,4-oxadiazole-2-yl]benzene (abbreviation: OXD-7); 3-(4-biphenylyl)-4-phenyl-5-(4-tert-butylphenyl)-1,2,4-triazole (abbreviation: TAZ); bathophenanthroline (abbreviation: BPhen); bathocuproin (abbreviation: BCP); and the like. The substances described here are mainly substances which have electron mobility of greater than or equal to $10^{-6}$ cm$^2$/Vs. Note that substances other than the above substances may be used for the electron transporting layer 114 as long as they are substances in which an electron transporting property is higher than a hole transporting property. In addition, the electron transporting layer 114 is not limited to a single layer but may have a stacked structure of two or more layers formed of the above-described substances.

In addition, the electron injecting layer 115 may be provided. For the electron injecting layer 115, an alkali metal, an alkaline earth metal, or a compound thereof, such as lithium fluoride (LiF), cesium fluoride (CsF), or calcium fluoride (CaF$_2$) can be used. For example, a layer formed of a substance with an electron transporting property containing an alkali metal, an alkaline earth metal, or a compound thereof, such as a layer formed of Alq containing magnesium (Mg), can be used. Note that when a layer formed of a substance with an electron transporting property which contains an alkali metal or an alkaline earth metal is used as the electron injecting layer 115, electrons can be efficiently injected from the second electrode 104, which is preferable.

For a substance which forms the second electrode 104, a metal with a low work function (specifically, less than or equal to 3.8 eV), an alloy, an electrically conductive compound, a mixture thereof, or the like can be used. As a specific example of such a cathode material, the following can be given: an element belonging to Group 1 or Group 2 of the periodic table, that is, an alkali metal such as lithium (Li) or cesium (Cs), an alkaline earth metal such as magnesium (Mg), calcium (Ca), or strontium (Sr), an alloy containing these (e.g., an MgAg alloy or an AlLi alloy), a rare-earth metal such as europium (Eu) or ytterbium (Yb), an alloy containing these, and the like. However, a layer having a function of promoting electron injection is provided between the second electrode 104 and the electron transporting layer 114, so that the second electrode 104 can be formed using various conductive materials such as Al, Ag, ITO, and indium tin oxide containing silicon or silicon oxide, regardless of their work functions.

As a formation method of the EL layer, various methods can be used regardless of whether a dry method or a wet method. For example, a vacuum evaporation method, an ink jetting method, a spin coating method, or the like may be used. A different film-formation method may be used for each electrode or each layer.

In the light-emitting element of the present invention having the structure as described above, current flows by a potential difference generated between the first electrode 102 and the second electrode 104 and holes and electrons are recombined in the EL layer 103; whereby light is emitted. More specifically, in the light-emitting layer 113 in the EL layer 103, a light-emitting region is formed in a region centered around where the first layer 121 and the second layer 122 meet.

Light emission is extracted to the outside through one or both of the first electrode 102 and the second electrode 104. Therefore, one or both of the first electrode 102 and the second electrode 104 are light-transmitting electrodes. In the case where only the first electrode 102 is a light-transmitting electrode, as shown in FIG. 1A, light is extracted from the substrate side through the first electrode 102. In the case where only the second electrode 104 is a light-transmitting electrode, as shown in FIG. 1B, light is extracted from the side opposite to the substrate through the second electrode 104. In the case where both the first electrode 102 and the second electrode 104 are light-transmitting electrodes, as shown in FIG. 1C, light is extracted from both the substrate side and the side opposite to the substrate through the first electrode 102 and the second electrode 104.

Note that a structure of the layers provided between the first electrode 102 and the second electrode 104 is not limited to the above structure. A structure other than the above may be employed as long as a light-emitting region in which holes and electrons are recombined is provided in a portion away from the first electrode 102 and the second electrode 104 in order to prevent quenching caused by proximity of the light-emitting region to a metal and the light-emitting layer includes the first layer 121 and the second layer 122.

That is, there is no particular limitation on the stacked structure of the layers. Layers formed of a substance with a high electron transporting property or a high hole transporting property, a substance with a high electron injecting property, a substance with a high hole injecting property, a substance with a bipolar property (a substance with a high electron transporting property and a high hole transporting property), a hole blocking material, and the like may be freely combined with the light-emitting layer of the present invention.

Figure 2:
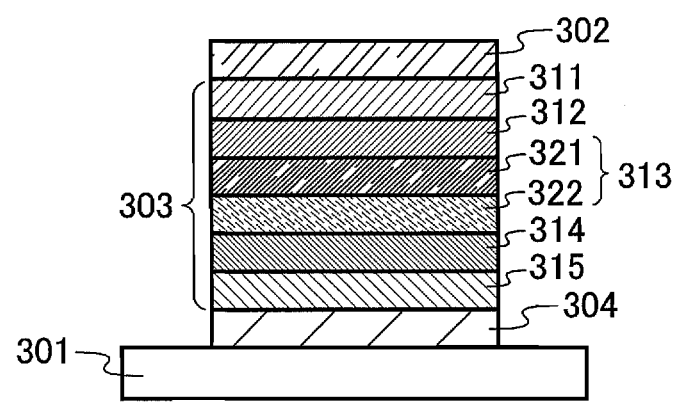
FIG. 2 is a diagram explaining a light-emitting element of the present invention.

A light-emitting element shown in FIG. 2 has a structure in which a second electrode 304 functioning as a cathode, an EL layer 303, and a first electrode 302 functioning as an anode are sequentially stacked over a substrate 301. The EL layer 303 includes an electron injecting layer 315, an electron transporting layer 314, a light-emitting layer 313, a hole transporting layer 312, and a hole injecting layer 311. The light-emitting layer 313 includes a first layer 321 and a second layer 322. The first layer 321 is provided closer to the first electrode 302 functioning as an anode than the second layer 322 is.

In this embodiment mode, the light-emitting element is formed over a substrate made of glass, plastic, or the like. A plurality of such light-emitting elements is manufactured over one substrate, so that a passive matrix light-emitting device can be manufactured. In addition, for example, a thin film transistor (TFT) may be manufactured over a substrate made of glass, plastic, or the like, and a light-emitting element which is electrically connected to the TFT may be manufactured. Accordingly, an active matrix light-emitting device in which driving of the light-emitting element is controlled by the TFT can be manufactured. Note that there is no particular limitation on a structure of the TFT. The TFT may be either a staggered TFT or an inversely-staggered TFT. Driver circuits formed over a TFT substrate may be formed using n-channel and p-channel TFTs, or using either an n-channel TFT or a p-channel TFT. In addition, there is no particular limitation on crystallinity of a semiconductor film used for the TFT. Either an amorphous semiconductor film or a crystalline semiconductor film may be used.

Since the light-emitting element of the present invention has good carrier balance, light emission efficiency is high. In addition, since the light emission efficiency is high, power consumption is low.

In addition, the light-emitting region of the light-emitting element of the present invention is not formed at an interface between the light-emitting layer and the hole transporting layer or an interface between the light-emitting layer and the electron transporting layer but in the vicinity of the center of the light-emitting layer; thus, the hole transporting layer or the electron transporting layer can be prevented from emitting light. Accordingly, light emission with good color purity can be obtained.

The light-emitting region of the light-emitting element of the present invention is not formed at the interface between the light-emitting layer and the hole transporting layer or the interface between the light-emitting layer and the electron transporting layer but in the vicinity of the center of the light-emitting layer. Thus, the light-emitting element is not affected by deterioration due to proximity of the light-emitting region to the hole transporting layer or the electron transporting layer. Accordingly, a light-emitting element which has less deterioration and a long lifetime can be obtained.

In addition, in the light-emitting element of the present invention, the recombination region 131 is large and the exciton density is decreased; thus, T-T annihilation is unlikely to occur even when a substance which emits phosphorescence is used as a substance with a high light-emitting property, and high light emission efficiency can be maintained.

Note that this embodiment mode can be appropriately combined with other embodiment modes.

[Embodiment Mode 2]

In this embodiment mode, a mode of a light-emitting element of the present invention having a structure in which a plurality of light-emitting units is stacked (hereinafter, referred to as a stacked element) will be explained with reference to FIG. 4. This light-emitting element has a plurality of light-emitting units between a first electrode and a second electrode.

Figure 4:
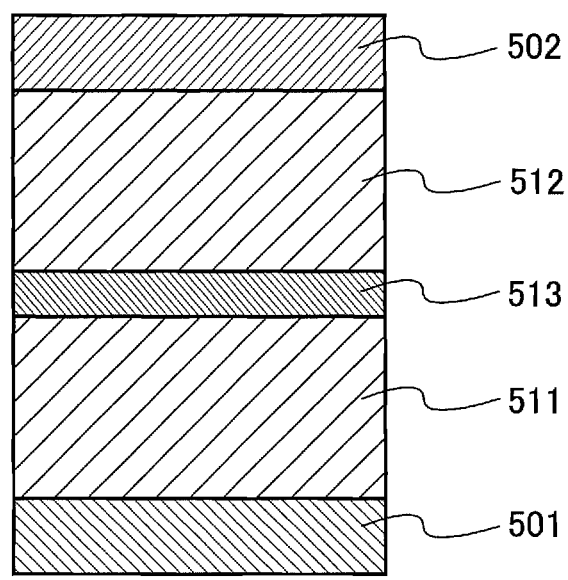
FIG. 4 is a diagram explaining a light-emitting element of the present invention.

In FIG. 4, a first light-emitting unit 511 and a second light-emitting unit 512 are stacked between a first electrode 501 and a second electrode 502. The first electrode 501 and the second electrode 502 can be similar to those described in Embodiment Mode 1. In addition, the first light-emitting unit 511 and the second light-emitting unit 512 may have the same structure or different structures. Structures of the first light-emitting unit 511 and the second light-emitting unit 512 may be similar to the structure of the EL layer described in Embodiment Mode 1.

A charge generation layer 513 contains a composite material of an organic compound and metal oxide. This composite material of an organic compound and metal oxide is the composite material described in Embodiment Mode 1. The composite material contains an organic compound and metal oxide such as $V_2O_5$, $MoO_3$, or $WO_3$. As the organic compound, various compounds such as aromatic amine compounds, carbazole derivatives, aromatic hydrocarbons, or high molecular compounds (e.g., oligomer, dendrimer, or polymer) can be used. Note that as the organic compound, an organic compound with a hole transporting property which has hole mobility of greater than or equal to $10^{-6}$ $cm^2/Vs$ is preferably used. However, other substances may also be used as long as the hole transporting properties thereof are higher than the electron transporting properties thereof. The composite material of an organic compound and metal oxide is superior in a carrier injecting property and a carrier transporting property, and therefore, low-voltage driving and low-current driving can be realized.

Note that the charge generation layer 513 may be formed in a combination of a composite material of an organic compound and metal oxide with another material. For example, the charge generation layer 513 may be formed in a combination of a layer containing the composite material of an organic compound and metal oxide with a layer containing one compound selected from substances with electron donating properties and a compound having a high electron transporting property. Alternatively, the charge generation layer 513 may be formed in a combination of a layer containing the composite material of an organic compound and metal oxide with a transparent conductive film.

In any case, the charge generation layer 513 sandwiched between the first light-emitting unit 511 and the second light-emitting unit 512 is acceptable as long as electrons are injected into a light-emitting unit on one side and holes are injected into a light-emitting unit on the other side when voltage is applied to the first electrode 501 and the second electrode 502.

Although this embodiment mode explains the light-emitting element having two light-emitting units, the present invention can be similarly applied to a light-emitting element in which three or more light-emitting units are stacked. When a plurality of light-emitting units between a pair of electrodes is arranged in such a manner that the plurality of light-emitting units is partitioned with a charge generation layer like the light-emitting element of this embodiment mode, a light-emitting element with a long lifetime can be realized in a high luminance region while maintaining low current density. In addition, when the light-emitting element is applied to lighting, voltage drop which would be caused by the resistance of an electrode material can be suppressed, and thus, homogeneous light emission in a large area can be realized. Moreover, a light-emitting device which can be driven with low voltage and consumes less electric power can be achieved.

When the light-emitting units are formed to have different emission colors from each other, light emission with a desired color can be obtained as a whole light-emitting element. For example, in the light-emitting element having two light-emitting units, when an emission color of the first light-emitting unit and the emission color of the second light-emitting unit are complementary colors, a light-emitting element which emits white light as a whole light-emitting element can be obtained. Note that "complementary color" refers to a relationship between colors which become achromatic color by being mixed. That is, white light emission can be obtained by mixture of light obtained from substances which emit the light of complementary colors. The same can be said for a light-emitting element which has three light-emitting units. For example, white light emission can be obtained as a whole light-emitting element when the emission color of the first light-emitting unit is red, the emission color of the second light-emitting unit is green, and the emission color of the third light-emitting unit is blue.

Note that this embodiment mode can be appropriately combined with other embodiment modes.

[Embodiment Mode 3]

In this embodiment mode, a light-emitting device having a light-emitting element of the present invention will be explained.

In this embodiment mode, a light-emitting device having the light-emitting element of the present invention in a pixel portion will be explained with reference to FIGS. 5A and 5B. FIG. 5A is a top view of a light-emitting device, and FIG. 5B is a cross-sectional diagram taken along lines A-A' and B-B' of FIG. 5A. This light-emitting device includes a driver circuit portion (source side driver circuit) 601, a pixel portion 602, and a driver circuit portion (gate side driver circuit) 603 which are shown by dashed lines in order to control light emission of the light-emitting element. Reference numeral 604 denotes a sealing substrate, 605 denotes a sealant, and a portion surrounded by the sealant 605 is a space 607.

A lead wiring 608 is a wiring for transmitting signals to be inputted to the source side driver circuit 601 and the gate side driver circuit 603, and the lead wiring 608 receives video signals, clock signals, start signals, reset signals, and the like from an FPC (flexible printed circuit) 609 serving as an external input terminal. Although only the FPC is shown here, the FPC may be provided with a printed wiring board (PWB). The light-emitting device in this specification includes not only a light-emitting device itself but also a light-emitting device with an FPC or a PWB attached thereto.

Next, a cross-sectional structure is explained with reference to FIG. 5B. Although the driver circuit portion and the pixel portion are formed over an element substrate 610, FIG. 5B shows the source side driver circuit 601 that is the driver circuit portion and one pixel in the pixel portion 602.

A CMOS circuit, which is a combination of an n-channel TFT 623 and a p-channel TFT 624, is formed as the source side driver circuit 601. Alternatively, the driver circuit may be formed using a CMOS circuit, a PMOS circuit, or an NMOS circuit. Although this embodiment mode shows a driver-integrated type where the driver circuit is formed over the substrate, the present invention is not limited to this, and the driver circuit may be formed outside the substrate, not over the substrate. The pixel portion 602 includes a plurality of pixels, each of which includes a switching TFT 611, a current controlling TFT 612, and a first electrode 613 electrically connected to a drain of the current controlling TFT 612. Note that an insulator 614 is formed so as to cover an end portion of the first electrode 613. Here, a positive photosensitive acrylic resin film is used for the insulator 614.

The insulator 614 is formed so as to have a curved surface having curvature at an upper end portion or a lower end portion thereof in order to obtain favorable coverage. For example, in the case of using a positive photosensitive acrylic as a material for the insulator 614, the insulator 614 is preferably formed so as to have a curved surface with a curvature radius (0.2 to 3 µm) only at the upper end portion thereof. Either a negative photosensitive acrylic which becomes insoluble in an etchant by light irradiation or a positive photosensitive acrylic which becomes soluble in an etchant by light irradiation can be used for the insulator 614.

An EL layer 616 and a second electrode 617 are formed over the first electrode 613. Various metals, alloys, electrically conductive compounds, or a mixture thereof can be used for a material for forming the first electrode 613. When the first electrode is used as an anode, it is preferable to use, among those materials, a metal, an alloy, an electrically conductive compound, a mixture thereof, or the like with a high work function (a work function of greater than or equal to 4.0 eV). For example, a stacked-layer structure of a film containing titanium nitride as its main component and a film containing aluminum as its main component, a three-layer structure of a titanium nitride film, a film containing aluminum as its main component, and a titanium nitride film, or the like can be used in addition to a single layer of indium tin oxide containing silicon, indium zinc oxide, a titanium nitride film, a chromium film, a tungsten film, a Zn film, a Pt film, or the like. When the first electrode 613 has a stacked layer structure, the resistance as a wiring is low and a favorable ohmic contact can be obtained. Furthermore, the first electrode 613 can function as an anode.

The EL layer 616 is formed by various methods such as an evaporation method using an evaporation mask, an ink-jet method, and a spin coating method. The EL layer 616 has the light-emitting layer described in Embodiment Mode 1. For other materials for forming the EL layer 616, a low molecular compound, oligomer, dendrimer, or a high molecular compound may be used. In addition, not only an organic compound but also an inorganic compound may be used for the material for the EL layer 616.

Various metals, alloys, electrically conductive compounds, and mixture thereof can be used for a material for forming the second electrode 617. When the second electrode is used as a cathode, it is preferable to use, among those materials, a metal, an alloy, an electrically conductive compound, a mixture thereof, or the like with a low work function (a work function of less than or equal to 3.8 eV). For example, an element belonging to Group 1 or Group 2 of the periodic table, that is, an alkali metal such as lithium (Li) or cesium (Cs), an alkaline earth metal such as magnesium (Mg), calcium (Ca), or strontium (Sr), an alloy containing these (e.g., an MgAg alloy and an AlLi alloy), and the like can be given. In the case where light generated in the EL layer 616 is transmitted through the second electrode 617, the second electrode 617 may also be formed using stacked layers of a thin metal film and a transparent conductive film (e.g., indium tin oxide (ITO), indium tin oxide containing silicon or silicon oxide, indium zinc oxide (IZO), or indium oxide containing tungsten oxide and zinc oxide (IWZO)).

When the sealing substrate 604 and the element substrate 610 are attached to each other with the sealant 605, a light-emitting element 618 is provided in the space 607 surrounded by the element substrate 610, the sealing substrate 604, and the sealant 605. The space 607 is filled with filler, and may be filled with an inert gas (e.g., nitrogen or argon), or the sealant 605.

An epoxy-based resin is preferably used for the sealant 605. Such material preferably allows as little moisture and oxygen as possible to penetrate. As a material for forming the sealing substrate 604, a plastic substrate made of FRP (fiberglass-reinforced plastics), PVF (polyvinyl fluoride), polyester, acrylic, or the like can be used as well as a glass substrate or a quartz substrate.

In such a manner, the light-emitting device having the light-emitting element of the present invention can be obtained.

The light-emitting device of the present invention has the light-emitting element described in Embodiment Mode 1 or Embodiment Mode 2. Thus, a light-emitting device with high light emission efficiency can be obtained.

In addition, since the light-emitting element with high light emission efficiency is included, a light-emitting device with low power consumption can be obtained.

Moreover, since a light-emitting element which emits light with good color purity is included, a light-emitting device which is excellent in color reproducibility can be obtained.

Furthermore, since a light-emitting element with less deterioration and a long lifetime is included, a light-emitting device with a long lifetime can be obtained.

Figure 6A:
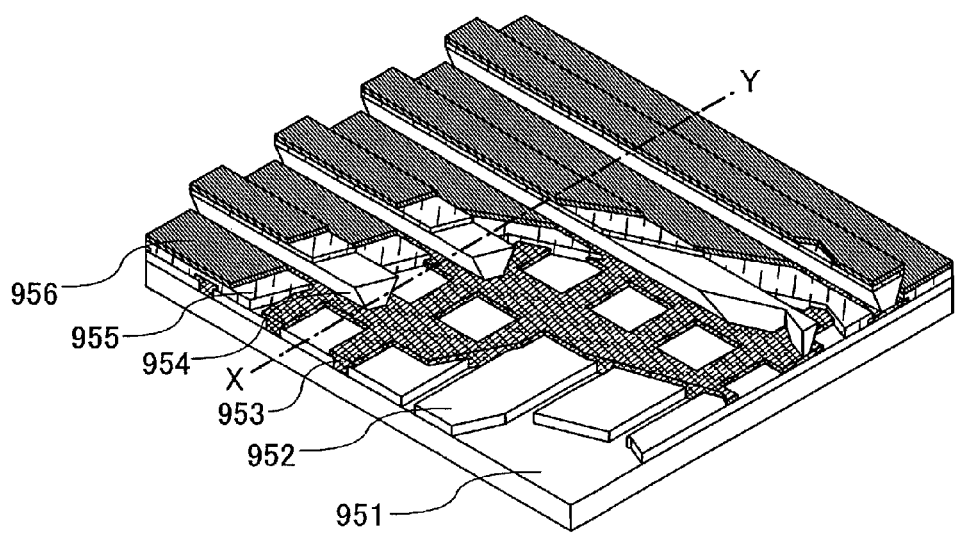
FIGS. 6A and 6B are diagrams explaining a light-emitting device of the present invention.
Figure 6B:
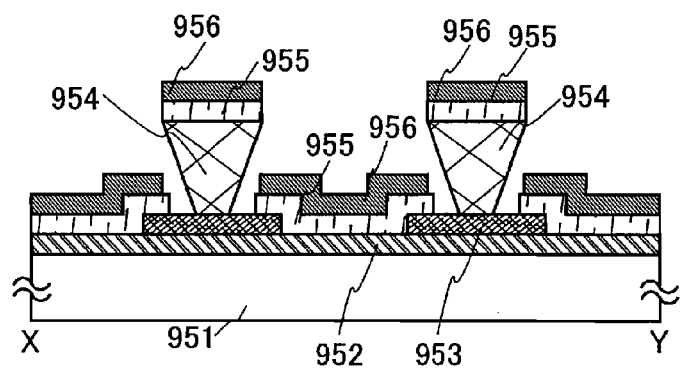

Although an active matrix light-emitting device in which operation of a light-emitting element is controlled by a transistor is explained in this embodiment mode as described above, a passive matrix light-emitting device may be alternatively used. FIG. 6A shows a perspective view of a passive matrix light-emitting device manufactured by application of the present invention. In FIGS. 6A and 6B, over a substrate 951, an EL layer 955 is provided between an electrode 952 and an electrode 956. An edge of the electrode 952 is covered with an insulating layer 953. A partition layer 954 is provided over the insulating layer 953. Side walls of the partition layer 954 slope so that a distance between one side wall and the other side wall becomes narrower toward a substrate surface. In other words, a cross section taken along the direction of a shorter side of the partition layer 954 has a trapezoidal shape, and a bottom surface of the trapezoid (a side of the trapezoid which is parallel to the surface of the insulating layer 953 and is in contact with the insulating layer 953) is shorter than a top surface (a side of the trapezoid which is parallel to the surface of the insulating layer 953 and is not in contact with the insulating layer 953). The partition layer 954 provided in this manner can prevent the light-emitting element from being defective due to static electricity or the like. In addition, the light-emitting element with high light emission efficiency of the present invention is included in a passive matrix light-emitting device, so that a light-emitting device with high light emission efficiency can be obtained.

Note that this embodiment mode can be appropriately combined with other embodiment modes.

[Embodiment Mode 4]

In this embodiment mode, an electronic appliance of the present invention, which includes the light-emitting device described in Embodiment Mode 3 as part thereof will be explained. The electronic appliance of the present invention has the light-emitting element described in Embodiment Mode 1 or 2 and a display portion with a long lifetime.

As electronic appliances manufactured using the light-emitting device of the present invention, the following are given: cameras such as video cameras and digital cameras, goggle type displays, navigation systems, audio reproducing devices (e.g., car audio stereos and audio component stereos), computers, game machines, portable information terminals (e.g., mobile computers, mobile phones, portable game machines, and electronic books), and image reproducing devices provided with recording media (specifically, a device capable of reproducing the content of a recording medium such as a digital versatile disc (DVD) and provided with a display device that can display the reproduced image), and the like. Specific examples of these electronic appliances are shown in FIGS. 7A to 7D.

Figure 7A:
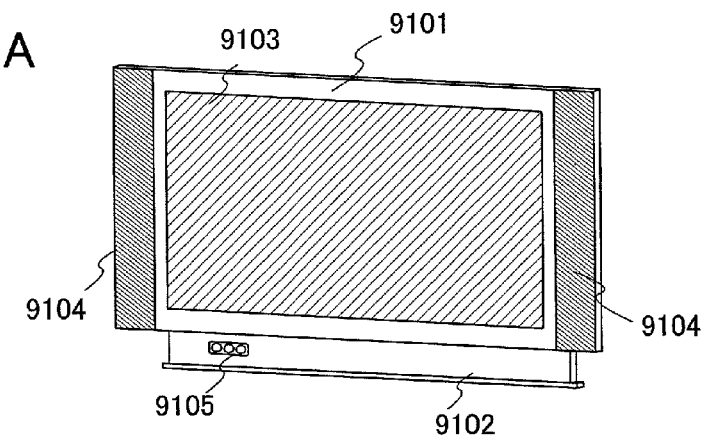
FIGS. 7A to 7D are diagrams explaining electronic appliances of the present invention.

FIG. 7A shows a television device of this embodiment mode, which includes a housing 9101, a support base 9102, a display portion 9103, a speaker portion 9104, a video input terminal 9105, and the like. In this television device, the display portion 9103 includes light-emitting elements similar to those described in Embodiment Modes 1 and 2, which are arranged in matrix. The light-emitting element has features of high light emission efficiency and low power consumption. In addition, the light-emitting element has features of good color purity and a long lifetime. Since the display portion 9103 including the light-emitting element also has the similar feature, this television device has less deterioration in image quality and low power consumption is achieved. With such features, the television device can have a significantly reduced number or size of degradation correction functions and power source circuits. Thus, reduction in size and weight of the housing 9101 and the support base 9102 can be achieved. Since low power consumption, high image quality, and reduction in size and weight are achieved in the television device of this embodiment mode, a product suitable for living environment can be provided. In addition, the television device of this embodiment mode has a display portion which is excellent in color reproducibility; thus, clear images can be seen.

Figure 7B:
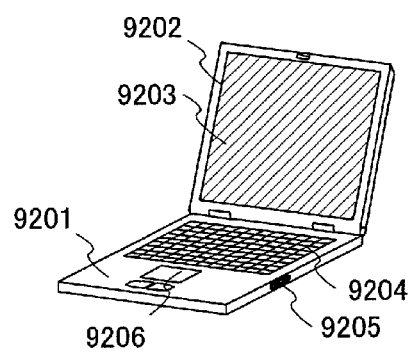

FIG. 7B shows a computer of this embodiment mode, which includes a main body 9201, a housing 9202, a display portion 9203, a keyboard 9204, an external connection port 9205, a pointing device 9206, and the like. In this computer, the display portion 9203 includes light-emitting elements similar to those described in Embodiment Modes 1 and 2, which are arranged in matrix. The light-emitting element has features of high light emission efficiency and low power consumption. In addition, the light-emitting element has features of excellent color purity and a long lifetime. Since the display portion 9203 including the light-emitting element also has the similar feature, this computer has less deterioration in image quality and low power consumption is achieved. With such features, the computer can have a significantly reduced number or size of degradation correction functions and power source circuits. Thus, reduction in size and weight of the main body 9201 and the housing 9202 can be achieved. Since low power consumption, high image quality, and reduction in size and weight are achieved in the computer of this embodiment mode, a product suitable for living environment can be provided. In addition, the computer is portable, and a computer that has a display portion which is able to withstand impacts by an external source that occur when it is being carried can be provided. Moreover, the computer of this embodiment mode has a display portion which is excellent in color reproducibility; thus, clear images can be seen.

Figure 7C:
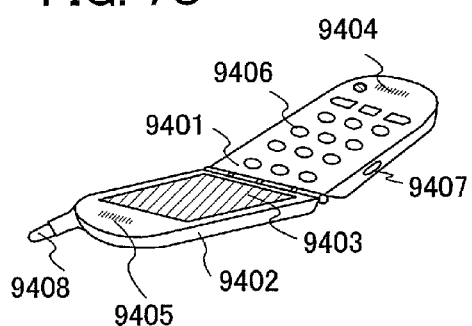

FIG. 7C shows a mobile phone of this embodiment mode, which includes a main body 9401, a housing 9402, a display portion 9403, an audio input portion 9404, an audio output portion 9405, operation keys 9406, an external connection port 9407, an antenna 9408, and the like. In this mobile phone, the display portion 9403 includes light-emitting elements similar to those described in Embodiment Modes 1 and 2, which are arranged in matrix. The light-emitting element has features of high light emission efficiency and low power consumption. In addition, the light-emitting element has features of good color purity and a long lifetime. Since the display portion 9403 including the light-emitting element also has the similar feature, this mobile phone has less deterioration in image quality and low power consumption is achieved. With such features, the mobile phone can have a significantly reduced number or size of degradation correction functions and power source circuits. Thus, reduction in size and weight of the main body 9401 and the housing 9402 can be achieved. Since low power consumption, high image quality, and reduction in size and weight are achieved in the mobile phone of this embodiment mode, a product suitable for being carried can be provided. In addition, a product that has a display which is able to withstand impacts by an external source that occur when it is being carried can be provided. Moreover, the mobile phone of this embodiment mode has a display portion which is excellent in color reproducibility; thus, clear images can be seen.

Figure 7D:
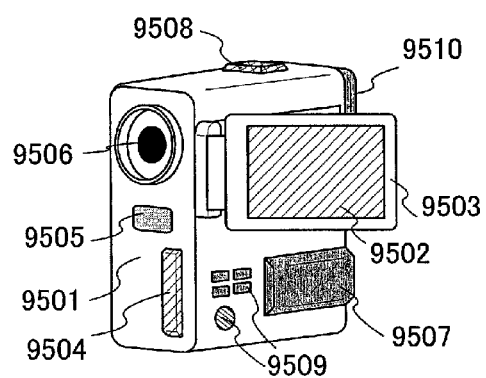

FIG. 7D shows a camera, which includes a main body 9501, a display portion 9502, a housing 9503, an external connection port 9504, a remote control receiving portion 9505, an image receiving portion 9506, a battery 9507, an audio input portion 9508, operation keys 9509, an eyepiece portion 9510, and the like. In this camera, the display portion 9502 includes light-emitting elements similar to those described in Embodiment Modes 1 and 2, which are arranged in matrix. The light-emitting element has features of high light emission efficiency and low power consumption. In addition, the light-emitting element has features of good color purity and a long lifetime. Since the display portion 9502 including the light-emitting element also has the similar feature, this camera has less deterioration in image quality and low power consumption is achieved. With such features, the camera can have a significantly reduced number or size of degradation correction functions and power source circuits. Thus, reduction in size and weight of the main body 9501 can be achieved. Since low power consumption, high image quality, and reduction in size and weight are achieved in the camera of this embodiment mode, a product suitable for being carried can be provided. In addition, a product that has a display which is able to withstand impacts by an external source that occur when it is being carried can be provided. Moreover, the camera of this embodiment mode has a display portion which is excellent in color reproducibility; thus, clear images can be seen.

Figure 8:
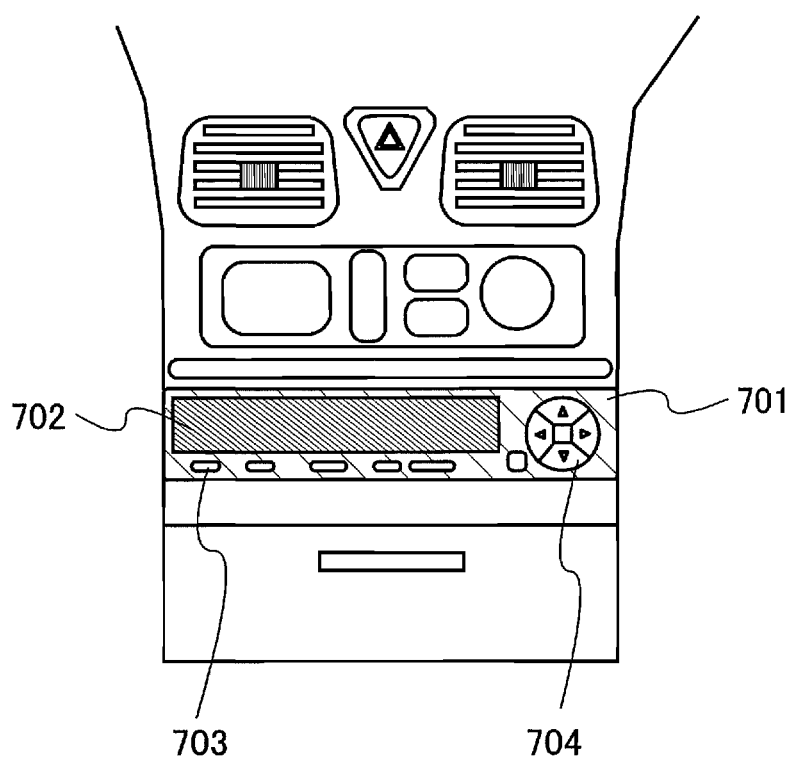
FIG. 8 is a diagram explaining an electronic appliance of the present invention.

FIG. 8 shows an audio reproducing device, specifically, a car audio stereo, which includes a main body 701, a display portion 702, and operation switches 703 and 704. The display portion 702 can be realized by the (passive matrix or active matrix) light-emitting device described in Embodiment Mode 3. Further, the display portion 702 may be formed using a segment type light-emitting device. In any case, the use of the light-emitting element of the present invention makes it possible to form a bright display portion with a long lifetime while achieving low power consumption with the use of vehicle power source (12 to 42 V). In addition, although this embodiment mode shows a car audio stereo, the light-emitting element of the present invention can also be used for a portable or home audio device.

Figure 9:
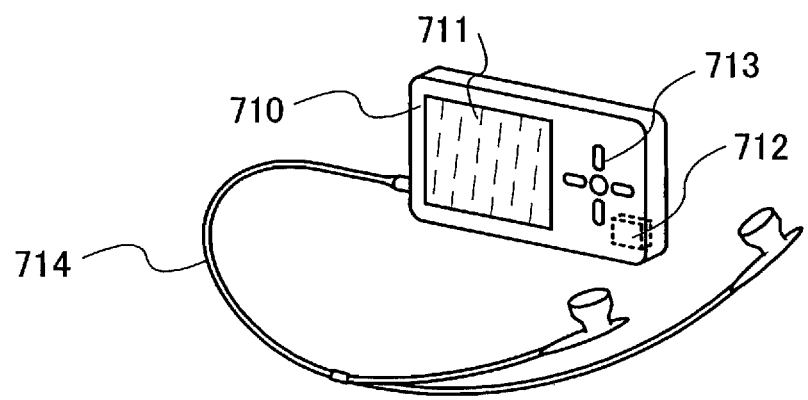
FIG. 9 is a diagram explaining an electronic appliance of the present invention.

FIG. 9 shows a digital player as an example thereof. The digital player shown in FIG. 9 includes a main body 710, a display portion 711, a memory portion 712, an operation portion 713, earphones 714, and the like. Headphones or wireless earphones can be used instead of the earphones 714. The display portion 711 can be realized by the (passive matrix or active matrix) light-emitting device described in Embodiment Mode 3. Further, the display portion 711 may be formed using a segment type light-emitting device. In any case, the use of the light-emitting element of the present invention makes it possible to form a bright display portion with a long lifetime which is capable of display even when a secondary battery (a nickel hydride battery or the like) is used, while achieving low power consumption. The memory portion 712 is formed using a hard disk or nonvolatile memory. For example, NAND type nonvolatile memory with recording capacity of 20 to 200 gigabytes (GBs) is used and the operation portion 713 is operated, so that an image or sound (e.g., music) can be recorded and reproduced. In the display portions 702 and 711, white characters are displayed against a black background, and thus, power consumption can be reduced. This is effective especially in a mobile audio device.

As described above, the range of application of the light-emitting device manufactured by application of the present invention is very wide. Thus, the light-emitting device can be applied to electronic appliances in various fields. When the present invention is applied, an electronic appliance with a highly reliable display portion with low power consumption can be provided.

In addition, the light-emitting device to which the present invention is applied has a light-emitting element with high light emission efficiency, and can be used as a lighting system. One mode of using the light-emitting element to which the present invention is applied as a lighting system is explained with reference to FIG. 10.

Figure 10:
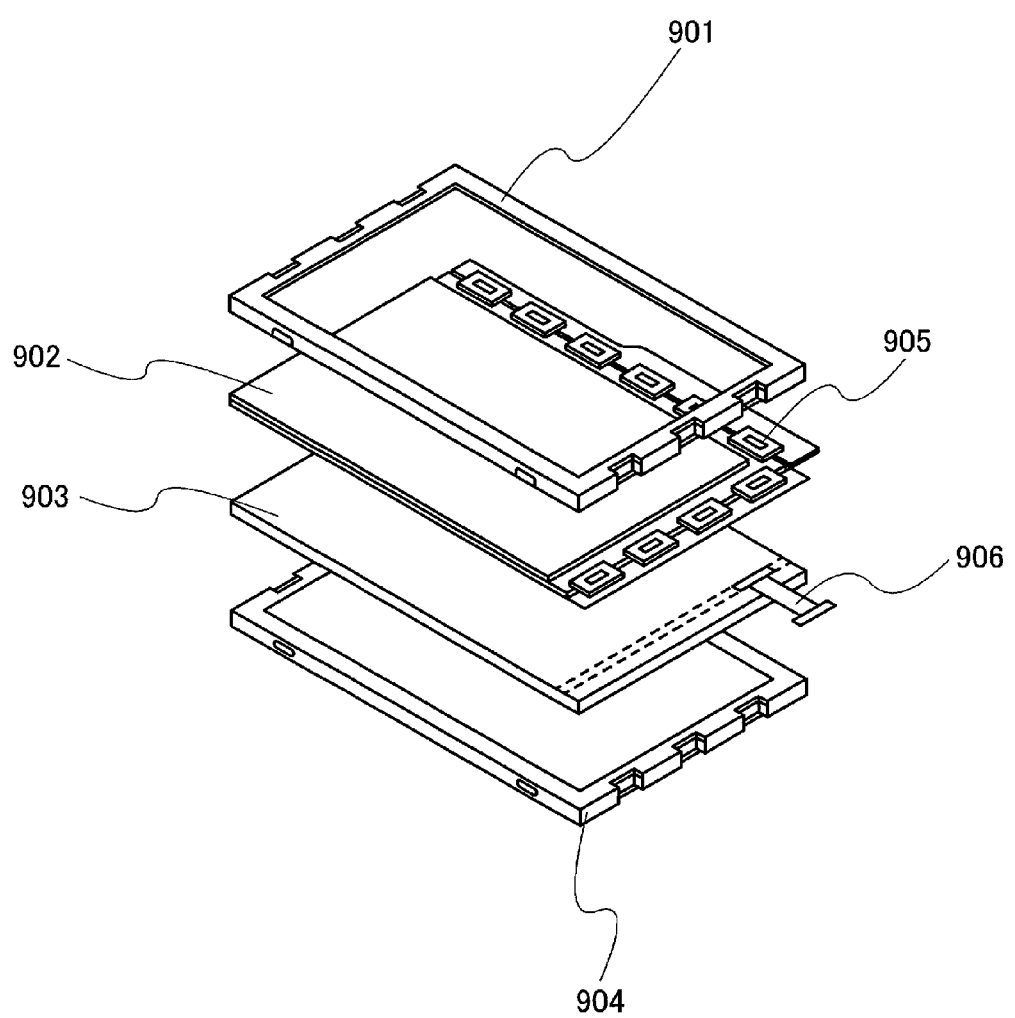
FIG. 10 is a diagram explaining an electronic appliance of the present invention.

FIG. 10 shows an example of a liquid crystal display device using the light-emitting device of the present invention as a backlight. The liquid crystal display device shown in FIG. 10 includes a housing 901, a liquid crystal layer 902, a backlight 903, and a housing 904. The liquid crystal layer 902 is connected to a driver IC 905. In addition, the light-emitting device of the present invention is used for the backlight 903, and current is supplied through a terminal 906.

When the light-emitting device of the present invention is used for a backlight of a liquid crystal display device, a backlight with high light emission efficiency can be obtained. In addition, a backlight with a long lifetime can be obtained. The light-emitting device of the present invention is a lighting device with plane light emission, and can have a large area. Thus, the backlight can have a large area and the liquid crystal display device can have a large area. Furthermore, since the light-emitting device of the present invention is thin and consumes less electric power, reduction in thickness and lower power consumption of a display device can also be achieved.

Figure 11:
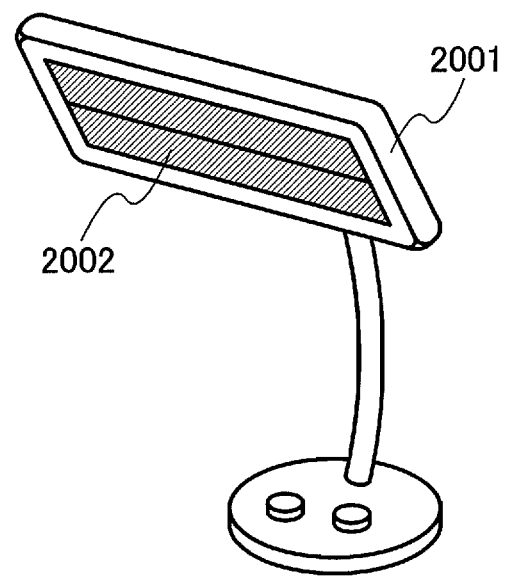
FIG. 11 is a diagram explaining a lighting system of the present invention.

FIG. 11 shows an example of using the light-emitting device of the present invention for a table lamp which is a lighting system. The table lamp shown in FIG. 11 has a housing 2001 and a light source 2002, and the light-emitting device of the present invention is used as the light source 2002. The light-emitting device of the present invention has a long lifetime; thus, the table lamp also has a long lifetime.

Figure 12:
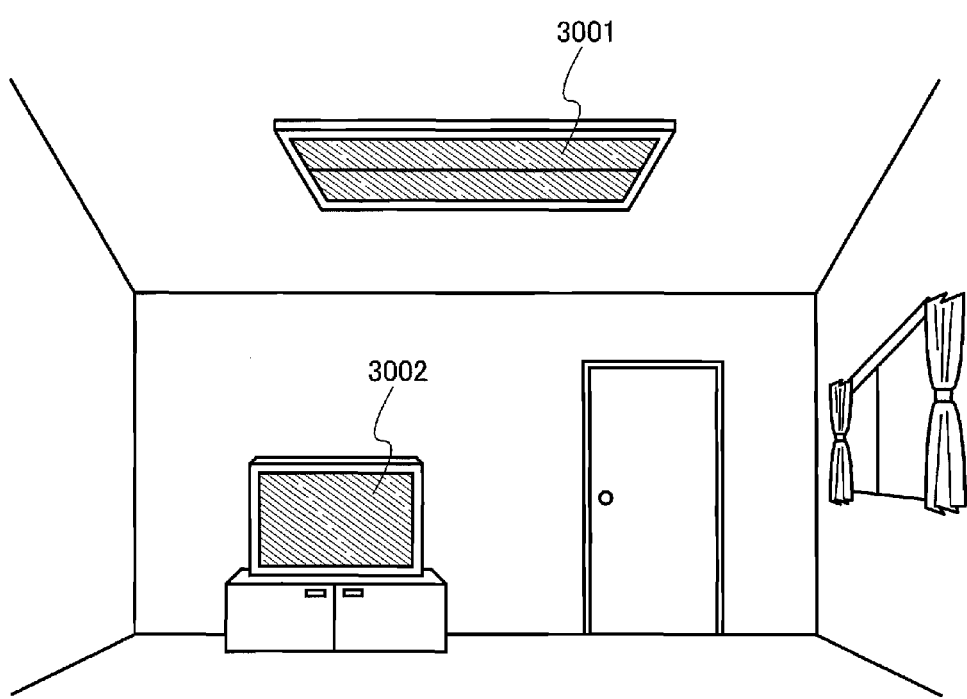
FIG. 12 is a diagram explaining a lighting system of the present invention.

FIG. 12 shows an example of using the light-emitting device of the present invention for an indoor lighting system 3001. Since the light-emitting device of the present invention can have a large area, the light-emitting device of the present invention can be used as a lighting system having a large emission area. In addition, since the light-emitting device of the present invention has a long lifetime, the light-emitting device of the present invention can be used as a lighting system with a long lifetime. When a television device 3002 of the present invention like the one shown in FIG. 7A is placed in a room in which the light-emitting device of the present invention is used as the indoor lighting system 3001, public broadcasting and movies can be watched. In such a case, since both of the devices have long lifetimes, frequency of replacement of the lighting system and the television device can be reduced, and damages on the environment can be reduced.

Note that this embodiment mode can be appropriately combined with other embodiment modes.

[Embodiment 1]

Figure 13:
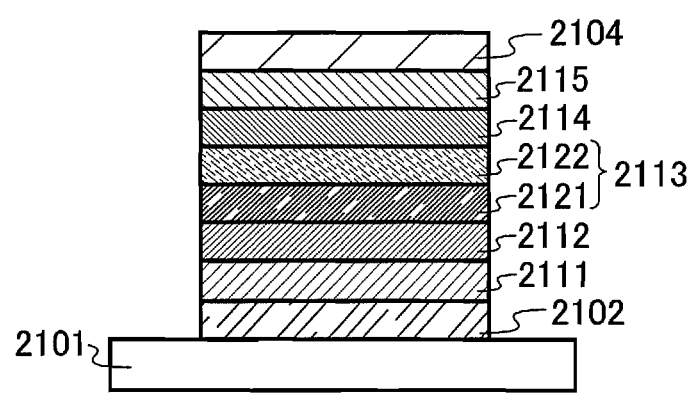
FIG. 13 is a diagram explaining a light-emitting element of Embodiments.

In this embodiment, a light-emitting element of the present invention will be specifically explained with reference to FIG. 13. Structural formulas of organic compounds used in Embodiments 1 to 3 are shown below.

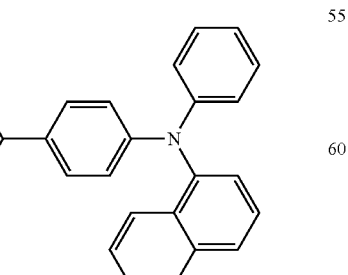

NPB

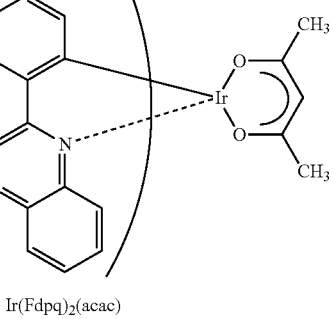

Ir(Fdpq)$_2$(acac)

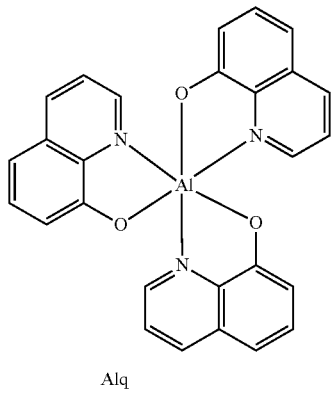

Alq

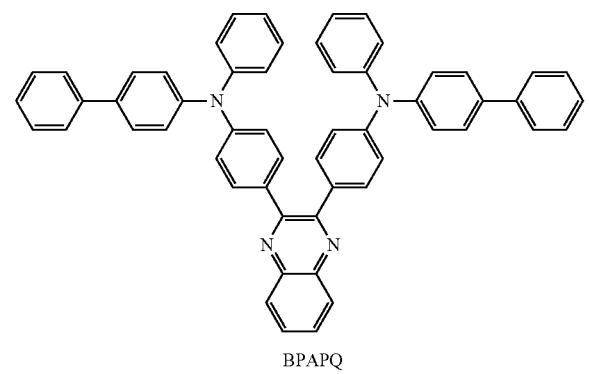

BPAPQ

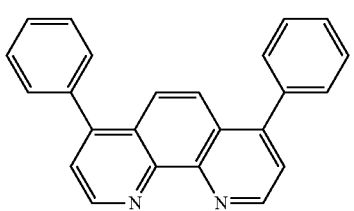

BPhen

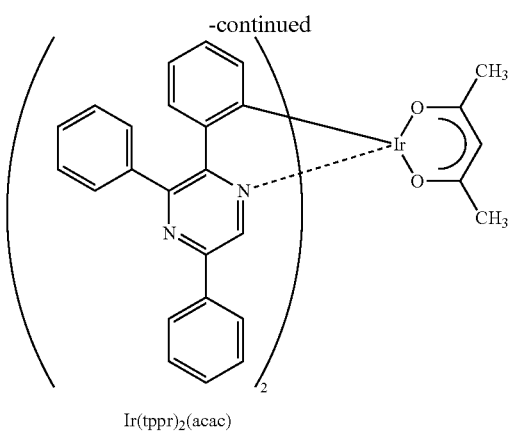

Ir(tppr)₂(acac)

(Light-Emitting Element 1)

First, a film of indium tin oxide containing silicon oxide was formed over a glass substrate 2101 by sputtering, so that a first electrode 2102 was formed. The thickness of the electrode 2102 was 110 nm and the area was 2 mm×2 mm.

Next, the substrate over which the first electrode 2102 was formed was fixed to a substrate holder which was provided in a vacuum evaporation apparatus so that the surface provided with the first electrode 2102 faced down. After the pressure was reduced to about $10^{-4}$ Pa, 4,4'-bis[N-(1-naphthyl)-N-phenylamino]biphenyl (abbreviation: NPB) and molybdenum oxide (VI) were co-evaporated over the first electrode 2102, so that a layer 2111 containing a composite material was formed. The thickness of the layer 2111 was 50 nm. The weight ratio of NPB to molybdenum oxide (VI) was adjusted to 4:1 (=NPB:molybdenum oxide). Note that a co-evaporation method is a method in which evaporation from a plurality of evaporation sources is performed at the same time in one treatment chamber.

Next, 4,4'-bis[N-(1-naphthyl)-N-phenylamino]biphenyl (abbreviation: NPB) was formed to have a thickness of 10 nm by an evaporation method using resistance heating, so that a hole transporting layer 2112 was formed.

Next, a light-emitting layer 2113 was formed over the hole transporting layer 2112. First, tris(8-quinolinolato)aluminum (abbreviation: Alq) and (acetylacetonato)bis[2,3-bis(4-fluorophenyl)quinoxalinato]iridium(III) (abbreviation: Ir(Fdpq)₂(acac)) were co-evaporated over the hole transporting layer 2112, so that a first layer 2121 was formed with a thickness of 10 nm. Here, the weight ratio of Alq to Ir(Fdpq)₂(acac) was adjusted to 1:0.05 (=Alq:Ir(Fdpq)₂(acac)). In addition, 2,3-bis{4-[N-(4-biphenylyl)-N-phenylamino]phenyl}quinoxaline (abbreviation: BPAPQ) and (acetylacetonato)bis[2,3-bis(4-fluorophenyl)quinoxalinato]iridium (III) (abbreviation: Ir(Fdpq)₂(acac)) were co-evaporated over the first layer 2121, so that a second layer 2122 was formed with a thickness of 20 nm. Here, the weight ratio of BPAPQ to Ir(Fdpq)₂(acac) was adjusted to 1:0.05 (=BPAPQ:Ir(Fdpq)₂(acac)).

After that, a film of tris(8-quinolinolato)aluminum (abbreviation: Alq) was formed to have a thickness of 10 nm over the light-emitting layer 2113 by an evaporation method using resistance heating, so that an electron transporting layer 2114 was formed.

Alq and lithium (Li) were co-evaporated over the electron transporting layer 2114, so that an electron injecting layer 2115 with a thickness of 50 nm was formed. Here, the weight ratio of Alq to lithium was adjusted to 1:0.01 (=Alq:lithium).

Finally, a film of aluminum was formed to have a thickness of 200 nm by an evaporation method using resistance heating, so that a second electrode 2104 was formed. In this manner, a light-emitting element 1 was manufactured.

(Comparative Light-Emitting Element 2)

First, a film of indium tin oxide containing silicon oxide was formed over a glass substrate by sputtering, so that a first electrode was formed. The thickness of the first electrode was 110 nm and the area was 2 mm×2 mm.

Next, the substrate over which the first electrode was formed was fixed to a substrate holder which was provided in a vacuum evaporation apparatus so that the surface provided with the first electrode faced down. After the pressure was reduced to about $10^{-4}$ Pa, 4,4'-bis[N-(1-naphthyl)-N-phenylamino]biphenyl (abbreviation: NPB) and molybdenum oxide (VI) were co-evaporated over the first electrode, so that a layer containing a composite material was formed. The thickness of the layer was 50 nm. The weight ratio of NPB to molybdenum oxide (VI) was adjusted to 4:1 (=NPB:molybdenum oxide). Note that a co-evaporation method is a method in which evaporation from a plurality of evaporation sources is performed at the same time in one treatment chamber.

Next, 4,4'-bis[N-(1-naphthyl)-N-phenylamino]biphenyl (abbreviation: NPB) was formed to have a thickness of 10 nm by an evaporation method using resistance heating, so that a hole transporting layer was formed.

Next, a light-emitting layer was formed over the hole transporting layer. 2,3-bis{4-[N-(4-biphenylyl)-N-phenylamino]phenyl}quinoxaline (abbreviation: BPAPQ) and (acetylacetonato)bis[2,3-bis(4-fluorophenyl)quinoxalinato]iridium (III) (abbreviation: Ir(Fdpq)₂(acac)) were co-evaporated, so that the light-emitting layer was formed with a thickness of 30 nm. Here, the weight ratio of BPAPQ to Ir(Fdpq)₂(acac) was adjusted to 1:0.05 (=BPAPQ:Ir(Fdpq)₂(acac)).

After that, a film of tris(8-quinolinolato)aluminum (abbreviation: Alq) was formed to have a thickness of 10 nm over the light-emitting layer by an evaporation method using resistance heating, so that an electron transporting layer was formed.

Alq and lithium (Li) were co-evaporated over the electron transporting layer, so that an electron injecting layer with a thickness of 50 nm was formed. Here, the weight ratio of Alq to lithium was adjusted to 1:0.01 (=Alq:lithium).

Finally, a film of aluminum was formed to have a thickness of 200 nm by an evaporation method using resistance heating, so that a second electrode was formed. In this manner, a comparative light-emitting element 2 was manufactured.

Figure 14:
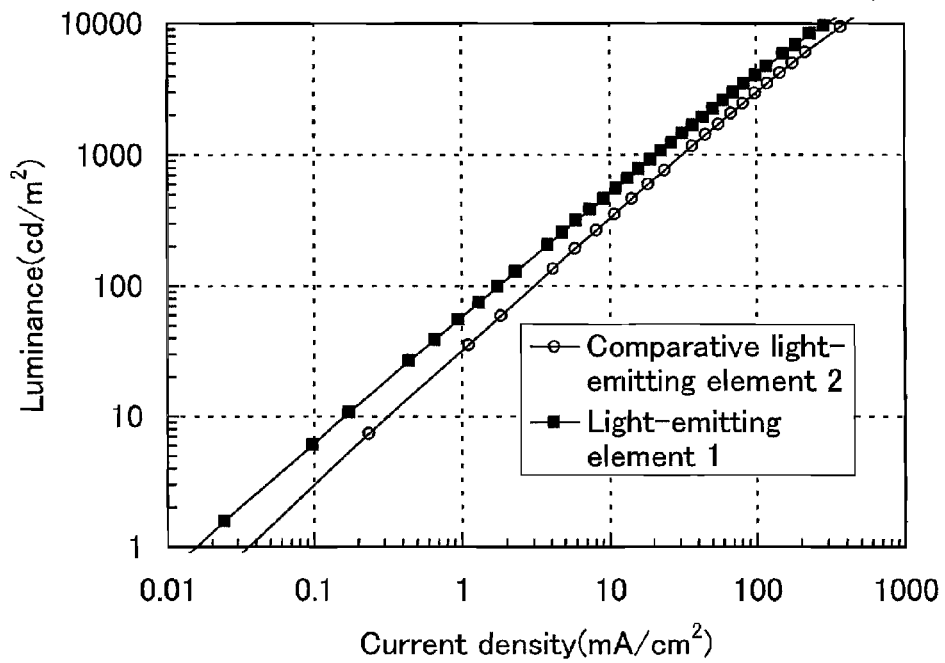
FIG. 14 is a graph showing current density-luminance characteristics of a light-emitting element manufactured in Embodiment 1.
Figure 15:
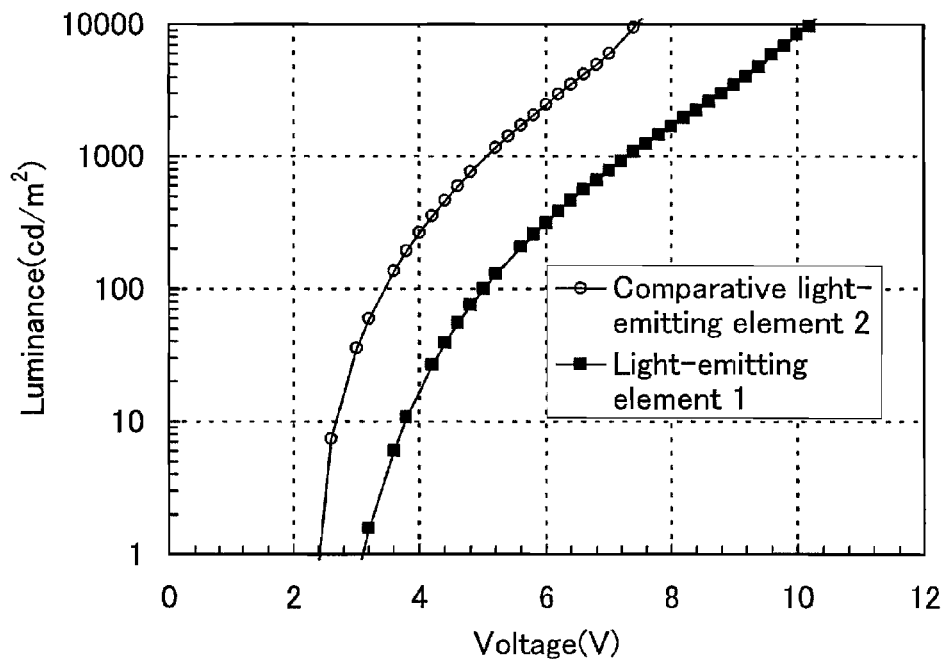
FIG. 15 is a graph showing voltage-luminance characteristics of a light-emitting element manufactured in Embodiment 1.
Figure 16:
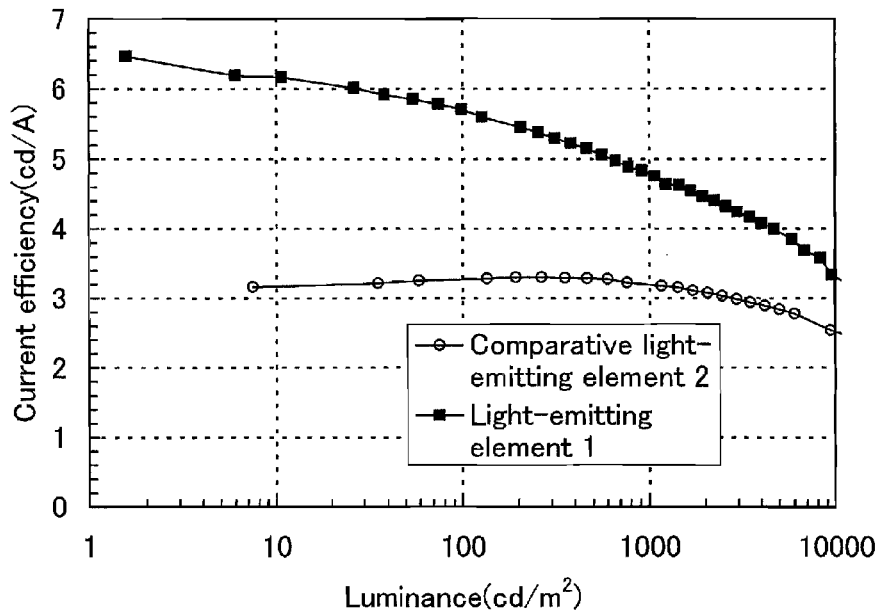
FIG. 16 is a graph showing luminance-current efficiency characteristics of a light-emitting element manufactured in Embodiment 1.
Figure 17:
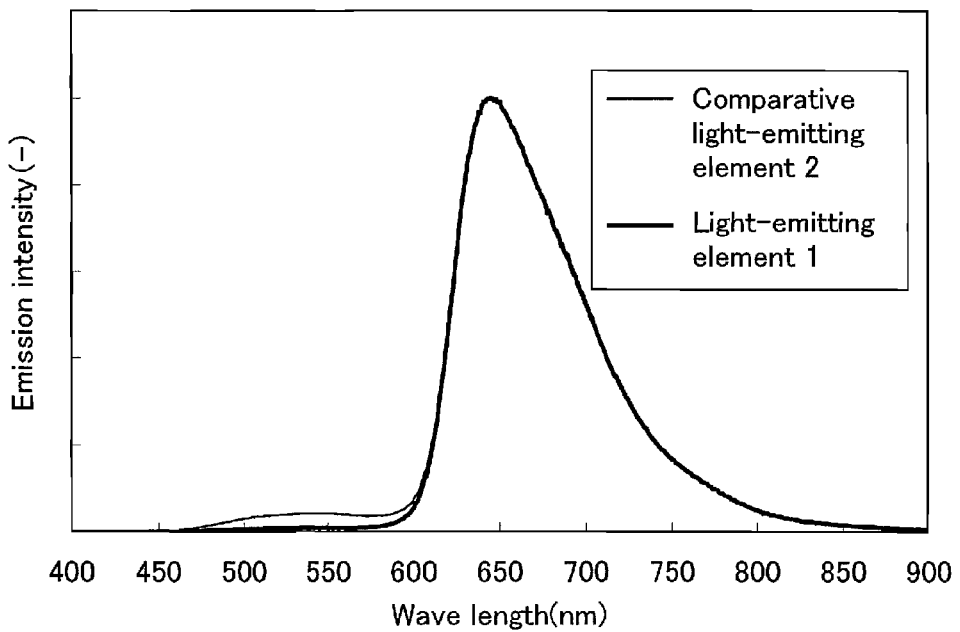
FIG. 17 is a graph showing an emission spectrum of a light-emitting element manufactured in Embodiment 1.

FIG. 14 shows current density-luminance characteristics of the light-emitting element 1 and the comparative light-emitting element 2. FIG. 15 shows voltage-luminance characteristics thereof. FIG. 16 shows luminance-current efficiency characteristics thereof. FIG. 17 shows light emission spectrums thereof when current of 1 mA was fed.

The CIE chromaticity coordinates of the comparative light-emitting element 2 at a luminance of 760 cd/m² were (x, y)=(0.64, 0.34), and emission of red light was obtained. The current efficiency, voltage, current density, power efficiency, and external quantum efficiency at the luminance of 760 cd/m² were 3.2 cd/A, 4.8 V, 23.6 mA/cm², 5.6 (lm/W), and 5.6%, respectively.

On the other hand, the CIE chromaticity coordinates of the light-emitting element 1 at a luminance of 1070 cd/m² were (x, y)=(0.70, 0.30), and emission of deep red light was obtained. The current efficiency, voltage, current density, power efficiency, and external quantum efficiency at the luminance of 1070 cd/m² were 4.8 cd/A, 7.4 V, 22.6 mA/cm², 2.0 (lm/W), and 10%, respectively.

Accordingly, the current efficiency and the external quantum efficiency of the light-emitting element 1 to which the present invention is applied are higher than those of the comparative light-emitting element 2. In addition, the light-emitting element 1 is a light-emitting element in which the power efficiency is higher and power consumption is less than those of the comparative light-emitting element 2.

Moreover, according to FIG. 17, the peak of the light emission spectrum in the comparative light-emitting element 2, which was observed at near 500 to 550 nm, was not observed in the light-emitting element 1. That is, in the light-emitting element 1 to which the present invention was applied, light emission from Alq that was the electron transporting layer could be suppressed and light emission with good color purity could be obtained.

Accordingly, application of the present invention makes it possible to obtain a light-emitting element with improved carrier balance and high light emission efficiency. In addition, a light-emitting element which consumes less electric power could be obtained. Moreover, a light-emitting element which emits light with good color purity could be obtained.

[Embodiment 2]

In this embodiment, a light-emitting element of the present invention will be specifically explained with reference to FIG. 13.

(Light-Emitting Element 3)

First, a film of indium tin oxide containing silicon oxide was formed over a glass substrate 2101 by sputtering, so that a first electrode 2102 was formed. The thickness of the first electrode 2102 was 110 nm and the area was 2 mm×2 mm.

Next, the substrate over which the first electrode 2102 was formed was fixed to a substrate holder which was provided in a vacuum evaporation apparatus so that the surface provided with the first electrode 2102 faced down. After the pressure was reduced to about $10^{-4}$ Pa, 4,4'-bis[N-(1-naphthyl)-N-phenylamino]biphenyl (abbreviation: NPB) and molybdenum oxide (VI) were co-evaporated over the first electrode 2102, so that a layer 2111 containing a composite material was formed. The thickness of the layer 2111 was 50 nm. The weight ratio of NPB to molybdenum oxide (VI) was adjusted to 4:1 (=NPB:molybdenum oxide). Note that a co-evaporation method is a method in which evaporation from a plurality of evaporation sources is performed at the same time in one treatment chamber.

Next, 4,4'-bis[N-(1-naphthyl)-N-phenylamino]biphenyl (abbreviation: NPB) was formed to have a thickness of 10 nm by an evaporation method using resistance heating, so that a hole transporting layer 2112 was formed.

Next, a light-emitting layer 2113 was formed over the hole transporting layer 2112. First, tris(8-quinolinolato)aluminum (abbreviation: Alq) and (acetylacetonato)bis[2,3-bis(4-fluorophenyl)quinoxalinato]iridium(III) (abbreviation: Ir(Fdpq)$_2$(acac)) were co-evaporated over the hole transporting layer 2112, so that a first layer 2121 was formed with a thickness of 15 nm. Here, the weight ratio of Alq to Ir(Fdpq)$_2$(acac) was adjusted to 1:0.1 (=Alq:Ir(Fdpq)$_2$(acac)). In addition, 2,3-bis{4-[N-(4-biphenylyl)-N-phenylamino]phenyl}quinoxaline (abbreviation: BPAPQ) and (acetylacetonato)bis[2,3-bis(4-fluorophenyl)quinoxalinato]iridium(III) (abbreviation: Ir(Fdpq)$_2$(acac)) were co-evaporated over the first layer 2121, so that a second layer 2122 was formed with a thickness of 15 nm. Here, the weight ratio of BPAPQ to Ir(Fdpq)$_2$(acac) was adjusted to 1:0.1 (=BPAPQ:Ir(Fdpq)$_2$(acac)).

After that, by an evaporation method using resistance heating, a film of tris(8-quinolinolato)aluminum (abbreviation: Alq) was formed to have a thickness of 15 nm over the light-emitting layer 2113, and a film of bathophenanthroline (abbreviation: BPhen) was formed to have a thickness of 30 nm, so that an electron transporting layer 2114 in which two layers were stacked was formed.

After that, a film of lithium fluoride (LiF) was formed to have a thickness of 1 nm over the electron transporting layer 2114 by an evaporation method using resistance heating, so that an electron injecting layer 2115 was formed.

Finally, a film of aluminum was formed to have a thickness of 200 nm by an evaporation method using resistance heating, so that a second electrode 2104 was formed. In this manner, a light-emitting element 3 was manufactured.

Figure 18:
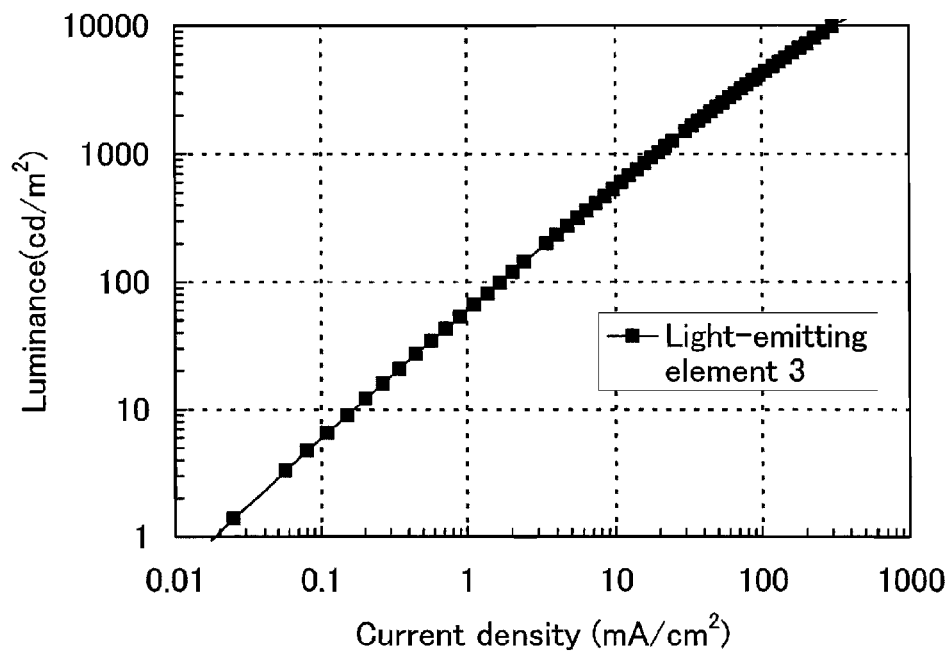
FIG. 18 is a graph showing current density-luminance characteristics of a light-emitting element manufactured in Embodiment 2.
Figure 19:
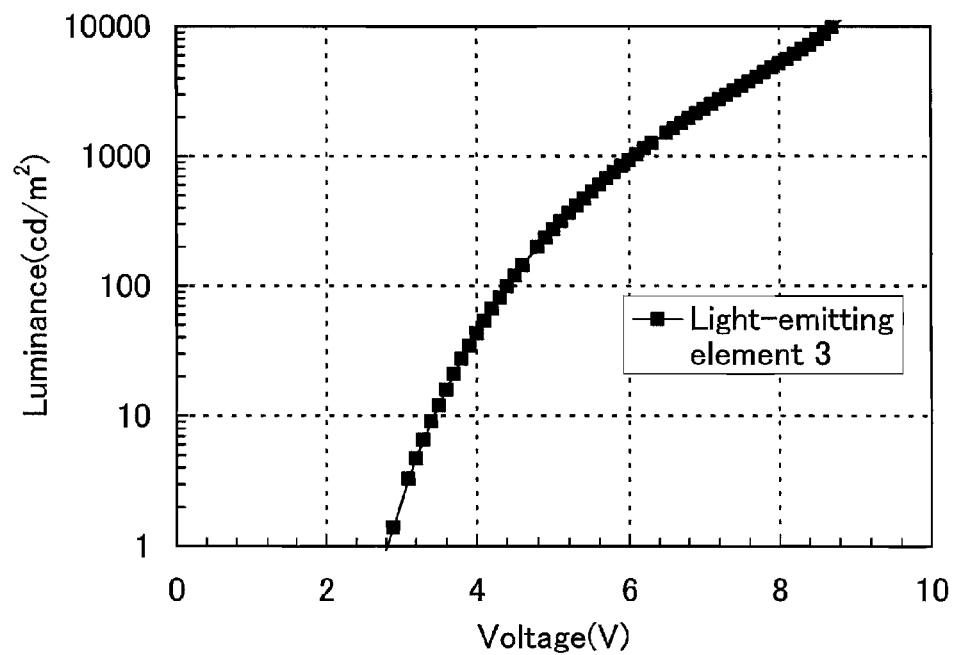
FIG. 19 is a graph showing voltage-luminance characteristics of a light-emitting element manufactured in Embodiment 2.
Figure 20:
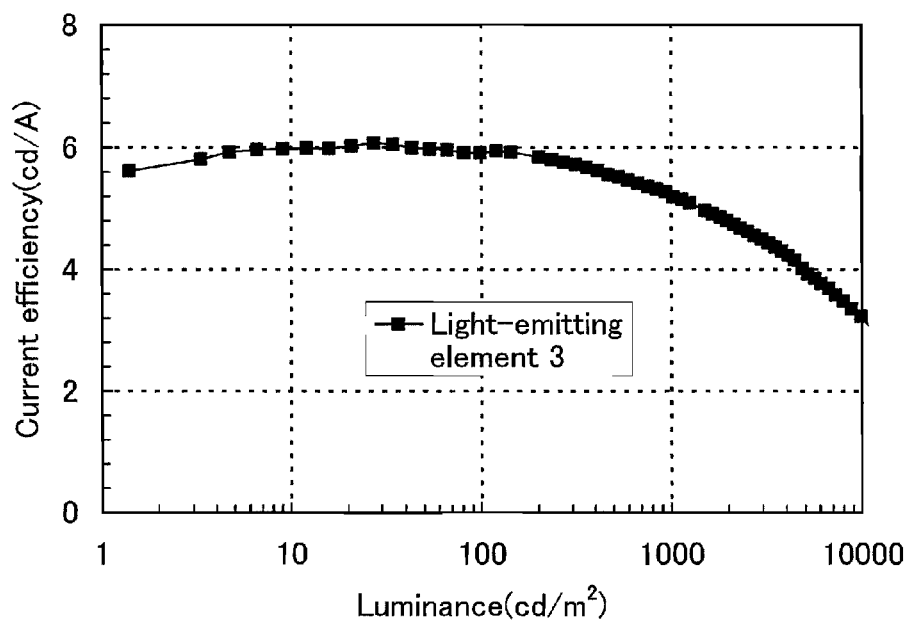
FIG. 20 is a graph showing luminance-current efficiency characteristics of a light-emitting element manufactured in Embodiment 2.
Figure 21:
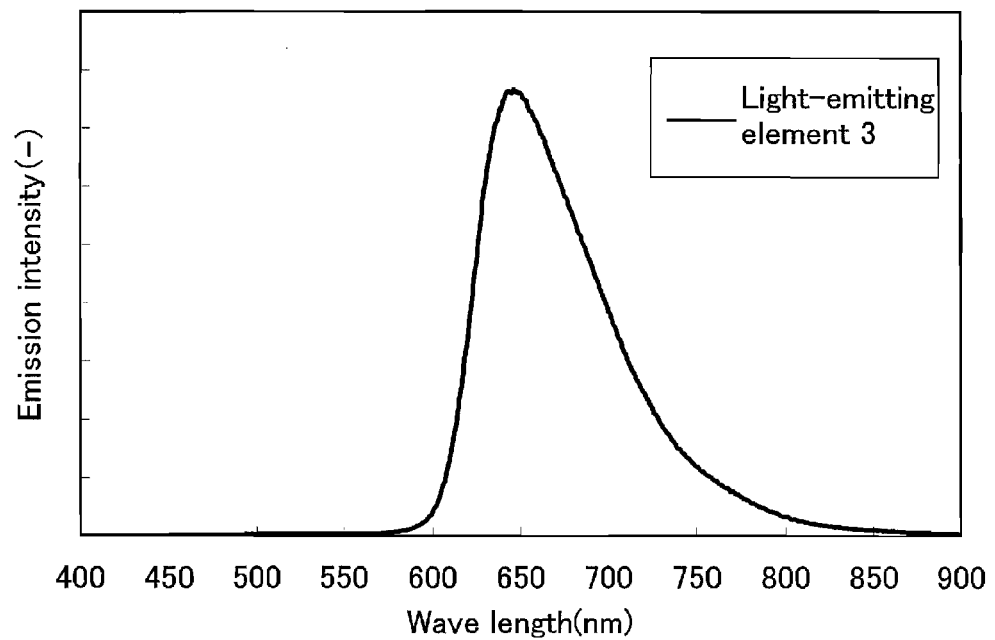
FIG. 21 is a graph showing an emission spectrum of a light-emitting element manufactured in Embodiment 2.

FIG. 18 shows current density-luminance characteristics of the light-emitting element 3. FIG. 19 shows voltage-luminance characteristics thereof. FIG. 20 shows luminance-current efficiency characteristics thereof. FIG. 21 shows light emission spectrums thereof when current of 1 mA was fed.

The CIE chromaticity coordinates of the light-emitting element 3 at a luminance of 1030 cd/m$^2$ were (x, y)=(0.70, 0.30), and emission of deep red light was obtained. The current efficiency, voltage, and current density at the luminance of 1030 cd/m$^2$ were 5.2 cd/A, 6.1 V, and 20.0 mA/cm$^2$, respectively.

Figure 22:
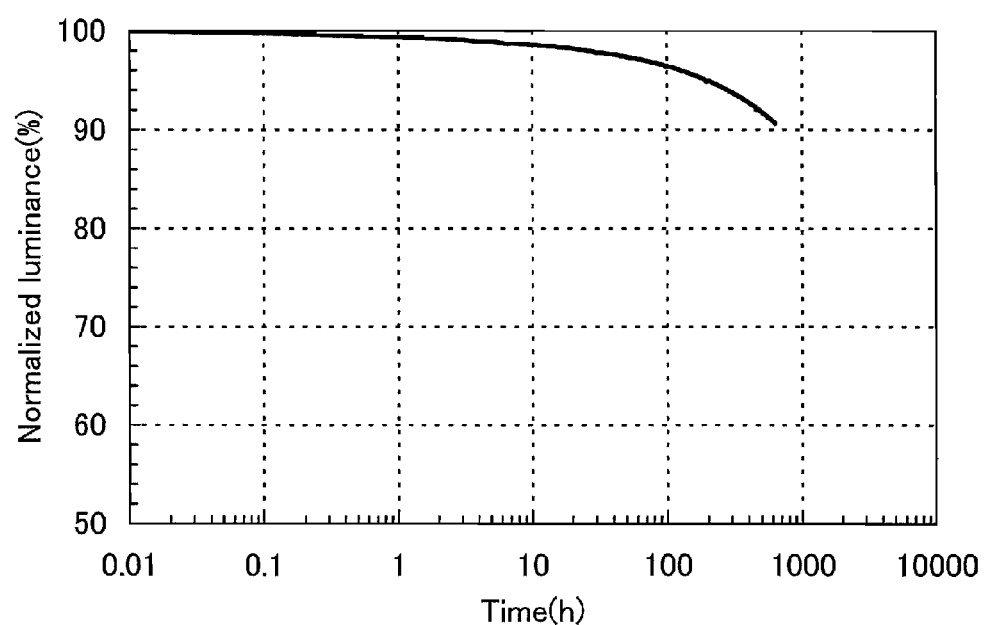
FIG. 22 is a graph showing time dependence of normalized luminance of a light-emitting element manufactured in Embodiment 2.

FIG. 22 shows the result of a continuous lighting test in which the light-emitting element 3 was continuously lit by constant current driving with an initial luminance set at 1000 cd/m$^2$. A vertical axis indicates the relative luminance (normalized luminance) on the assumption that 1000 cd/m$^2$ is 100%. When a continuous lighting test was conducted in which the light-emitting element 3 was continuously lit by constant current driving with the initial luminance set at 1000 cd/m$^2$, 91% of the initial luminance was obtained after 630 hours. In addition, when time when luminance reached 90% of the initial luminance was roughly estimated, it was about 700 hours, and when time when luminance reached 50% of the initial luminance (half-life) was roughly estimated, it was about 20000 hours. Accordingly, the light-emitting element 3 was a light-emitting element with a very long lifetime.

Accordingly, application of the present invention makes it possible to obtain a light-emitting element with improved carrier balance and high light emission efficiency. In addition, a light-emitting element which consumes less electric power could be obtained. Moreover, a light-emitting element with a long lifetime could be obtained.

[Embodiment 3]

In this embodiment, a light-emitting element of the present invention will be specifically explained with reference to FIG. 13.

(Light-Emitting Element 4)

First, a film of indium tin oxide containing silicon oxide was formed over a glass substrate 2101 by sputtering, so that a first electrode 2102 was formed. The thickness of the first electrode 2102 was 110 nm and the area was 2 mm×2 mm.

Next, the substrate over which the first electrode 2102 was formed was fixed to a substrate holder which was provided in a vacuum evaporation apparatus so that the surface provided with the first electrode 2102 faced down. After the pressure was reduced to about $10^{-4}$ Pa, 4,4'-bis[N-(1-naphthyl)-N-phenylamino]biphenyl (abbreviation: NPB) and molybdenum oxide (VI) were co-evaporated over the first electrode 2102, so that a layer 2111 containing a composite material was formed. The thickness of the layer 2111 was 50 nm. The weight ratio of NPB to molybdenum oxide (VI) was adjusted to 4:1 (=NPB:molybdenum oxide). Note that a co-evaporation method is a method in which evaporation from a plurality of evaporation sources is performed at the same time in one treatment chamber.

Next, 4,4'-bis[N-(1-naphthyl)-N-phenylamino]biphenyl (abbreviation: NPB) was formed to have a thickness of 10 nm by an evaporation method using resistance heating, so that a hole transporting layer 2112 was formed.

Next, a light-emitting layer 2113 was formed over the hole transporting layer 2112. First, bis(2-methyl-8-quinolinolato)(4-phenylphenolato)aluminum (abbreviation: BAlq) and (acetylacetonato)bis(2,3,5-triphenylpyrazinato)iridium(III) (abbreviation: Ir(tppr)$_2$(acac)) were co-evaporated over the hole transporting layer 2112, so that a first layer 2121 was formed with a thickness of 10 nm. Here, the weight ratio of BAlq to Ir(tppr)$_2$(acac) was adjusted to 1:0.06 (=BAlq:Ir(tppr)$_2$(acac)). In addition, 2,3-bis{4-[N-(4-biphenylyl)-N-phenylamino]phenyl}quinoxaline (abbreviation: BPAPQ) and (acetylacetonato)bis(2,3,5-triphenylpyrazinato)iridium (III) (abbreviation: Ir(tppr)$_2$(acac)) were co-evaporated over the first layer 2121, so that a second layer 2122 was formed with a thickness of 20 nm. Here, the weight ratio of BPAPQ to Ir(tppr)$_2$(acac) was adjusted to 1:0.06 (=BPAPQ:Ir(tppr)$_2$(acac)).

After that, a film of tris(8-quinolinolato)aluminum (abbreviation: Alq) was formed to have a thickness of 10 nm over the light-emitting layer 2113 by an evaporation method using resistance heating, so that an electron transporting layer 2114 was formed.

Alq and lithium (Li) were co-evaporated over the electron transporting layer 2114, so that an electron injecting layer 2115 with a thickness of 50 nm was formed. Here, the weight ratio of Alq to lithium was adjusted to 1:0.01 (=Alq:lithium).

Finally, a film of aluminum was formed to have a thickness of 200 nm by an evaporation method using resistance heating, so that a second electrode 2104 was formed. In this manner, a light-emitting element 4 was manufactured.

(Comparative Light-Emitting Element 5)

First, a film of indium tin oxide containing silicon oxide was formed over a glass substrate by sputtering, so that a first electrode was formed. The thickness of the first electrode was 110 nm and the area was 2 mm×2 mm.

Next, the substrate over which the first electrode was formed was fixed to a substrate holder which was provided in a vacuum evaporation apparatus so that the surface provided with the first electrode faced down. After the pressure was reduced to about $10^{-4}$ Pa, 4,4'-bis[N-(1-naphthyl)-N-phenylamino]biphenyl (abbreviation: NPB) and molybdenum oxide (VI) were co-evaporated over the first electrode, so that a layer containing a composite material was formed. The thickness of the layer was 50 nm. The weight ratio of NPB to molybdenum oxide (VI) was adjusted to 4:1 (=NPB:molybdenum oxide). Note that a co-evaporation method is a method in which evaporation from a plurality of evaporation sources is performed at the same time in one treatment chamber.

Next, 4,4'-bis[N-(1-naphthyl)-N-phenylamino]biphenyl (abbreviation: NPB) was formed to have a thickness of 10 nm by an evaporation method using resistance heating, so that a hole transporting layer was formed.

Next, a light-emitting layer was formed over the hole transporting layer. 2,3-bis{4-[N-(4-biphenylyl)-N-phenylamino]phenyl}quinoxaline (abbreviation: BPAPQ) and (acetylacetonato)bis(2,3,5-triphenylpyrazinato)iridium(III) (abbreviation: Ir(tppr)$_2$(acac)) were co-evaporated, so that the light-emitting layer was formed with a thickness of 30 nm. Here, the weight ratio of BPAPQ to Ir(tppr)$_2$(acac) was adjusted to 1:0.06 (=BPAPQ: Ir(tppr)$_2$(acac)).

After that, a film of tris(8-quinolinolato)aluminum (abbreviation: Alq) was formed to have a thickness of 10 nm over the light-emitting layer by an evaporation method using resistance heating, so that an electron transporting layer was formed.

Alq and lithium (Li) were co-evaporated over the electron transporting layer, so that an electron injecting layer with a thickness of 50 nm was formed. Here, the weight ratio of Alq to lithium was adjusted to 1:0.01 (=Alq:lithium).

Finally, a film of aluminum was formed to have a thickness of 200 nm by an evaporation method using resistance heating, so that a second electrode was formed. In this manner, a comparative light-emitting element 5 was manufactured.

Figure 23:
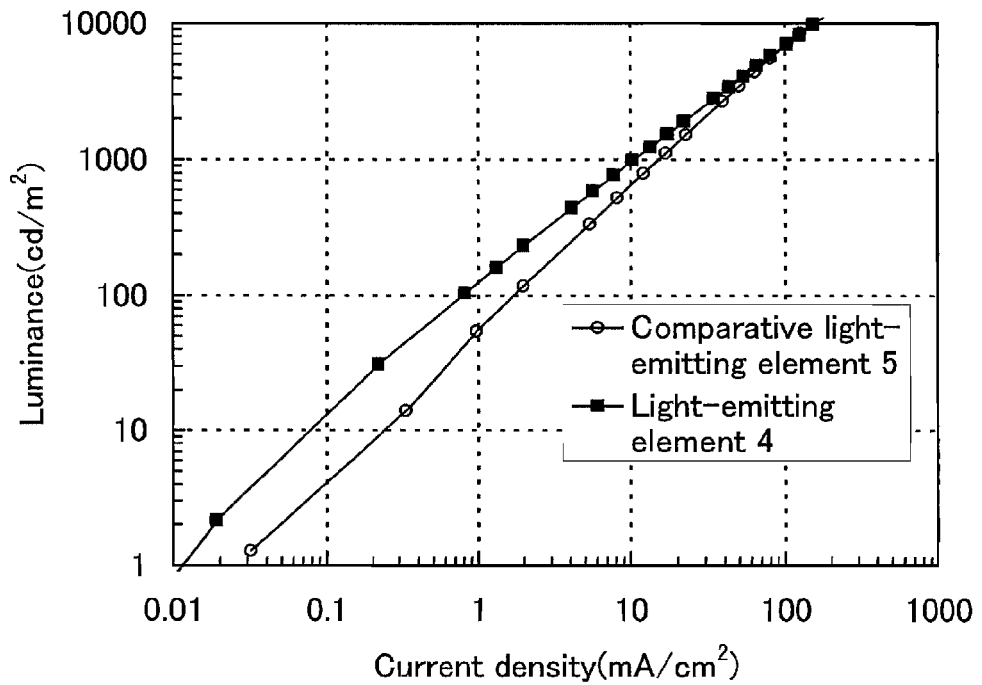
FIG. 23 is a graph showing current density-luminance characteristics of a light-emitting element manufactured in Embodiment 3.
Figure 24:
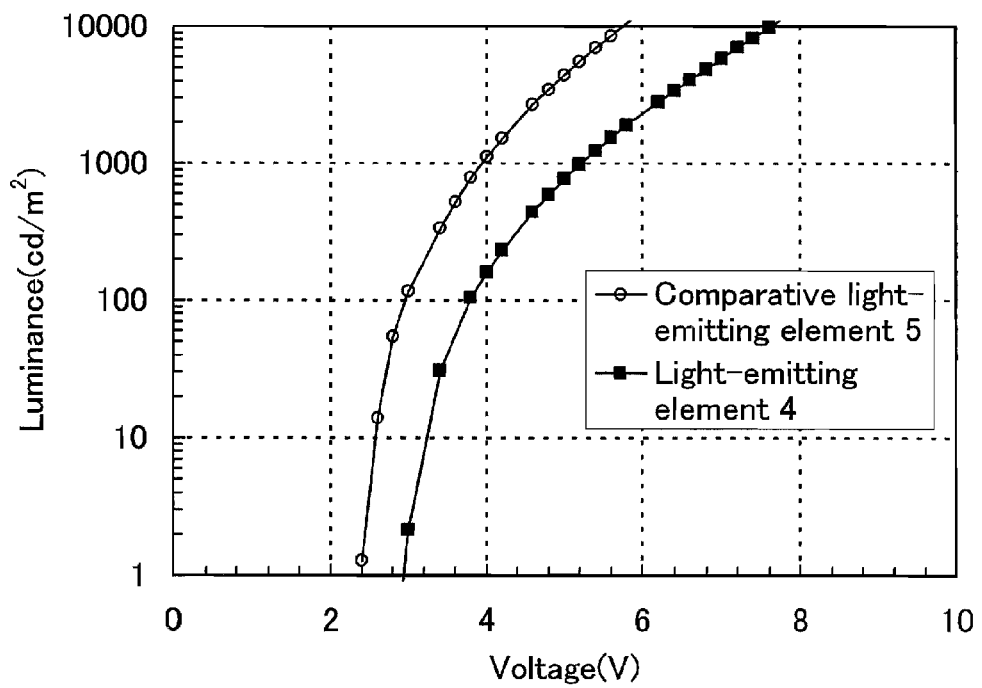
FIG. 24 is a graph showing voltage-luminance characteristics of light-emitting element manufactured in Embodiment 3.
Figure 25:
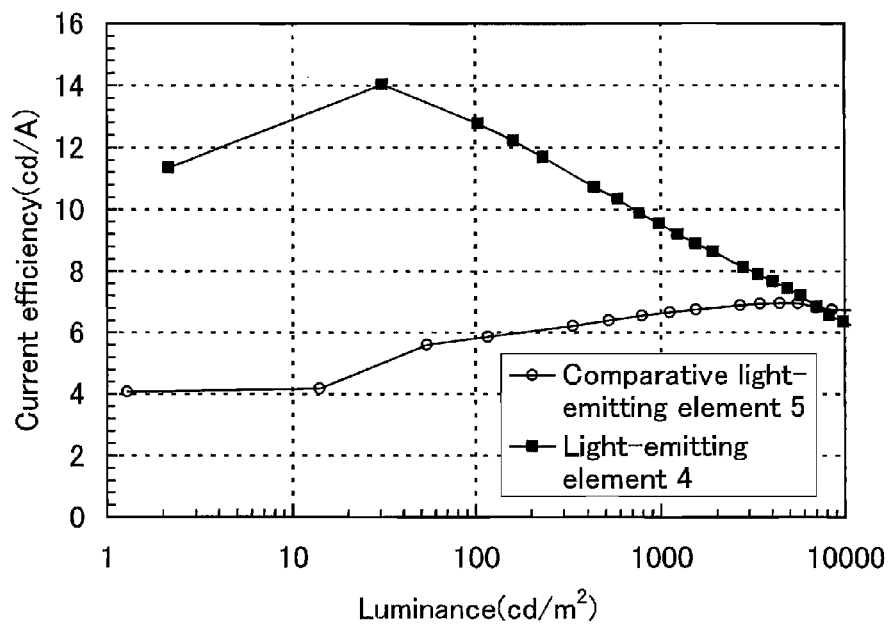
FIG. 25 is a graph showing luminance-current efficiency characteristics of a light-emitting element manufactured in Embodiment 3.
Figure 26:
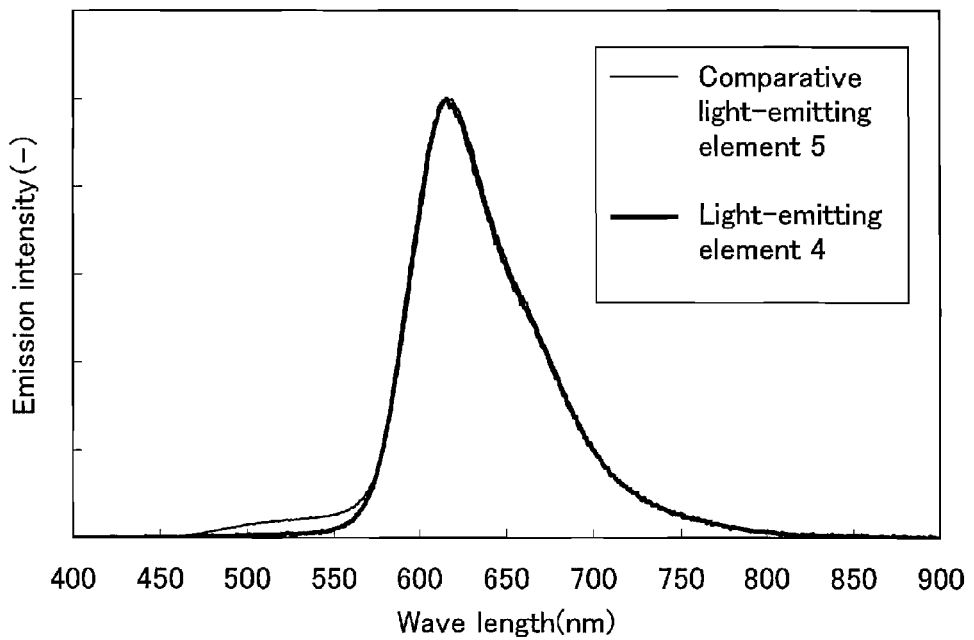
FIG. 26 is a graph showing an emission spectrum of a light-emitting element manufactured in Embodiment 3.

FIG. 23 shows current density-luminance characteristics of the light-emitting element 4 and the comparative light-emitting element 5. FIG. 24 shows voltage-luminance characteristics thereof. FIG. 25 shows luminance-current efficiency characteristics thereof. FIG. 26 shows light emission spectrums thereof when current of 1 mA was fed.

The CIE chromaticity coordinates of the comparative light-emitting element 5 at a luminance of 1120 cd/m$^2$ were (x, y)=(0.63, 0.36), and emission of orange-red light was obtained. The current efficiency, voltage, current density, power efficiency, and external quantum efficiency at the luminance of 1120 cd/m$^2$ were 6.7 cd/A, 4.0 V, 16.8 mA/cm$^2$, 5.2 (lm/W), and 4.7%, respectively.

On the other hand, the CIE chromaticity coordinates of the light-emitting element 4 at a luminance of 980 cd/m$^2$ were (x, y)=(0.65, 0.35), and emission of red light was obtained. The current efficiency, voltage, current density, power efficiency, and external quantum efficiency at the luminance of 980 cd/m$^2$ were 9.5 cd/A, 5.2 V, 10.3 mA/cm$^2$, 5.8 (lm/W), and 7.0%, respectively.

Accordingly, the current efficiency and the external quantum efficiency of the light-emitting element 4 to which the present invention is applied are higher than those of the comparative light-emitting element 5. In addition, the light-emitting element 4 is a light-emitting element in which the power efficiency is higher and power consumption is less than those of the comparative light-emitting element 5.

Moreover, according to FIG. 26, the peak of the light emission spectrum in the comparative light-emitting element 5, which was observed at near 500 to 550 nm, was not observed in the light-emitting element 4. That is, in the light-emitting element 4 to which the present invention was applied, light emission from Alq that was the electron transporting layer could be suppressed and light emission with good color purity could be obtained.

Accordingly, application of the present invention makes it possible to obtain a light-emitting element with improved carrier balance and high light emission efficiency. In addition, a light-emitting element which consumes less electric power could be obtained. Moreover, a light-emitting element which emits light with good color purity could be obtained.

[Embodiment 4]

In this embodiment, the reduction reaction characteristics of 2,3-bis{4-[N-(4-biphenylyl)-N-phenylamino]phenyl}quinoxaline (abbreviation: BPAPQ), (acetylacetonato)bis[2,3-bis(4-fluorophenyl)quinoxalinato]iridium(III) (abbreviation Ir(Fdpq)$_2$(acac)), and (acetylacetonato)bis(2,3,5-triphenylpyrazinato)iridium(III) (abbreviation: Ir(tppr)$_2$(acac)) which were used for the light-emitting layers of the light-emitting element 1, light-emitting element 3, and light-emitting element 4 to which the present invention was applied were measured by cyclic voltammetry (CV) measurement. In addition, the LUMO levels of BPAPQ, Ir(Fdpq)$_2$(acac), and Ir(tppr)$_2$(acac) were obtained from the measurement results. Note that an electrochemical analyzer (ALS model 600A, manufactured by BAS Inc.) was used for the measurement.

A solution for the CV measurement was prepared in such a manner that dehydrated dimethylformamide (DMF) (manufactured by Sigma-Aldrich Corp., 99.8%, catalogue number: 22705-6,) was used for a solvent, tetra-n-buthylammonium perchlorate (n-Bu$_4$NClO$_4$) (manufactured by Tokyo Chemical Industry Co., Ltd., catalog number: T0836), which was supporting electrolyte, was dissolved so as to be contained at a concentration of 100 mmol/L, and furthermore, an object to be measured was dissolved so as to be contained at a concentration of 1 mmol/L. A platinum electrode (manufactured by BAS Inc., PTE platinum electrode) was used as a working electrode, a platinum electrode (manufactured by BAS Inc., Pt counter electrode for VC-3, (5 cm)) was used as an auxiliary electrode, and an Ag/Ag$^+$ electrode (manufactured by BAS Inc., RE-5 reference electrode for nonaqueous solvent) was used as a reference electrode. Note that the measurement was conducted at room temperature (20 to 25° C.).

(Calculation of the Potential Energy of the Reference Electrode with Respect to the Vacuum Level)

First, potential energy (eV) of the reference electrode (Ag/Ag$^+$ electrode) used in this embodiment with respect to the vacuum level was calculated. That is, the Fermi level of the Ag/Ag$^+$ electrode was calculated. It is known that the oxidation-reduction potential of ferrocene in methanol is +0.610 [V vs. SHE] (Reference: Christian R. Goldsmith et al., J. Am. Chem. Soc., Vol. 124, No. 1, pp. 83-96, 2002). On the other hand, when the oxidation-reduction potential of ferrocene in methanol was calculated using the reference electrode used in this embodiment, the result was +0.20 V [vs. Ag/Ag+]. Thus, it was found that the potential energy of the reference electrode used in this embodiment was lower than that of the standard hydrogen electrode by 0.41 [eV].

Here, it is also known that the potential energy of the standard hydrogen electrode with respect to the vacuum level is −4.44 eV (Reference: Toshihiro Ohnishi and Tamami Koyama, High Molecular EL Material (Kyoritsu shuppan), pp. 64-67). Accordingly, the potential energy of the reference electrode used in this embodiment with respect to the vacuum level could be calculated to be −4.44−0.41=−4.85 [eV].

MEASUREMENT EXAMPLE 1

BPAPQ

In Measurement Example 1, the reduction reaction characteristics of BPAPQ were observed by cyclic voltammetry (CV) measurement. 100 cycles of measurement was conducted at a scan speed of 0.1 V/sec.

Figure 28:
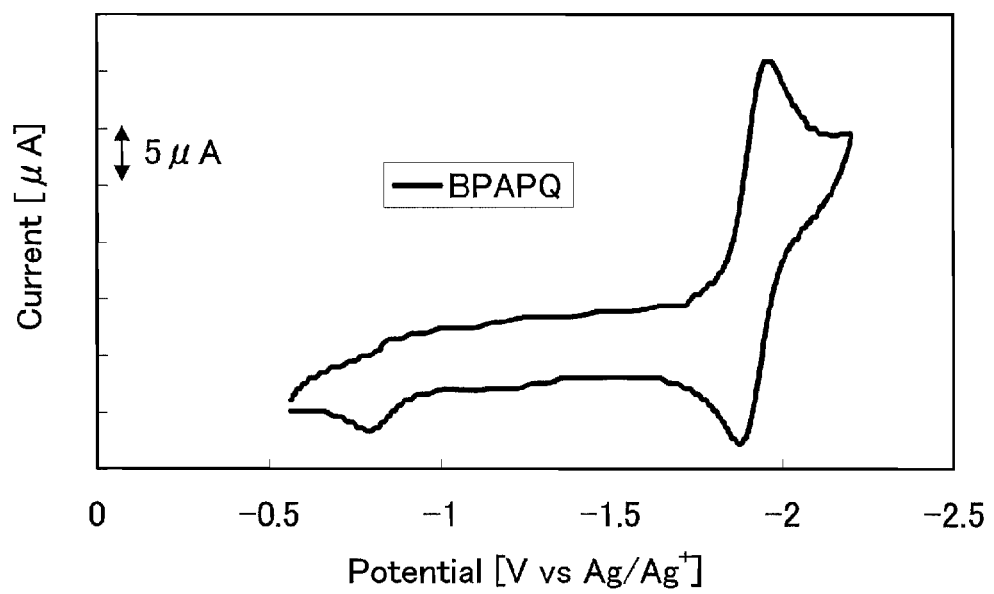
FIG. 28 is a graph showing reduction reaction characteristics of BPAPQ.

FIG. 28 shows the measurement result of the reduction reaction characteristics. Note that in the measurement of the reduction reaction characteristics, the scan in which the electric potential of a working electrode with respect to a reference electrode was changed from −0.56 to −2.20 V, and then changed from −2.20 to −0.56 V was assumed as one cycle.

As shown in FIG. 28, a reduction peak potential $E_{pc}$ was −1.95 V and an oxidation peak potential $E_{pa}$ was −1.86 V. Accordingly, a half-wave potential (an intermediate potential between $E_{pc}$ and $E_{pa}$) can be calculated to be −1.91 V. This shows that BPAPQ can be reduced by electrical energy of −1.91 [V vs. Ag/Ag$^+$], and this energy corresponds to the LUMO level. Here, the potential energy of the reference electrode used in this embodiment with respect to the vacuum level is −4.85 [eV] as described above. Thus, it was found that the LUMO level of BPAPQ was −4.85−(−1.91)=−2.94 [eV].

MEASUREMENT EXAMPLE 2

Ir(Fdpq)$_2$(acac)

In Measurement Example 2, the reduction reaction characteristics of Ir(Fdpq)$_2$(acac) were observed by cyclic voltammetry (CV) measurement. 100 cycles of measurement was conducted at a scan speed of 0.1 V/sec.

Figure 29:
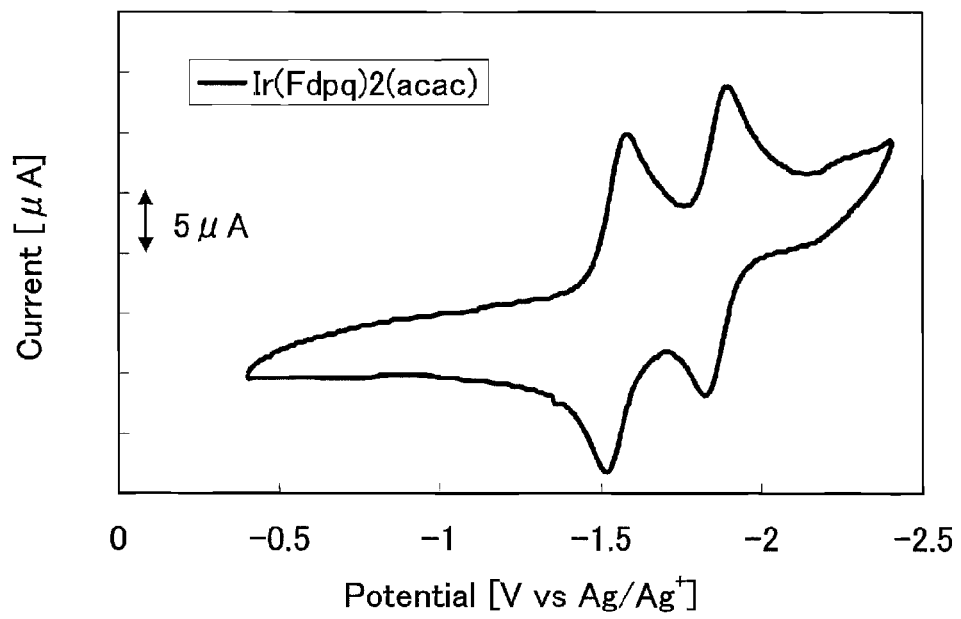
FIG. 29 is a graph showing reduction reaction characteristics of Ir(Fdpq)$_2$(acac)

FIG. 29 shows the measurement result of the reduction reaction characteristics. Note that in the measurement of the reduction reaction characteristics, the scan in which the electric potential of the working electrode with respect to the reference electrode was changed from −0.40 to −2.40 V, and then changed from −2.40 to −0.40 V was assumed as one cycle.

As shown in FIG. 29, a reduction peak potential $E_{pc}$ was −1.58 V and an oxidation peak potential $E_{pa}$ was −1.51 V. Accordingly, a half-wave potential (an intermediate potential between $E_{pc}$ and $E_{pa}$) can be calculated to be −1.55 V. This shows that Ir(Fdpq)$_2$(acac) can be reduced by electrical energy of −1.55 [V vs. Ag/Ag$^+$], and this energy corresponds to the LUMO level. Here, the potential energy of the reference electrode used in this embodiment with respect to the vacuum level is −4.85 [eV] as described above. Thus, it was found that the LUMO level of Ir(Fdpq)$_2$(acac) was −4.85−(−1.55)=−3.30 [eV].

MEASUREMENT EXAMPLE 3

Ir(tppr)$_2$(acac)

In Measurement Example 3, the reduction reaction characteristics of Ir(Fdpq)$_2$(acac) were observed by cyclic voltammetry (CV) measurement. 100 cycles of measurement was conducted at a scan speed of 0.1 V/sec.

Figure 30:
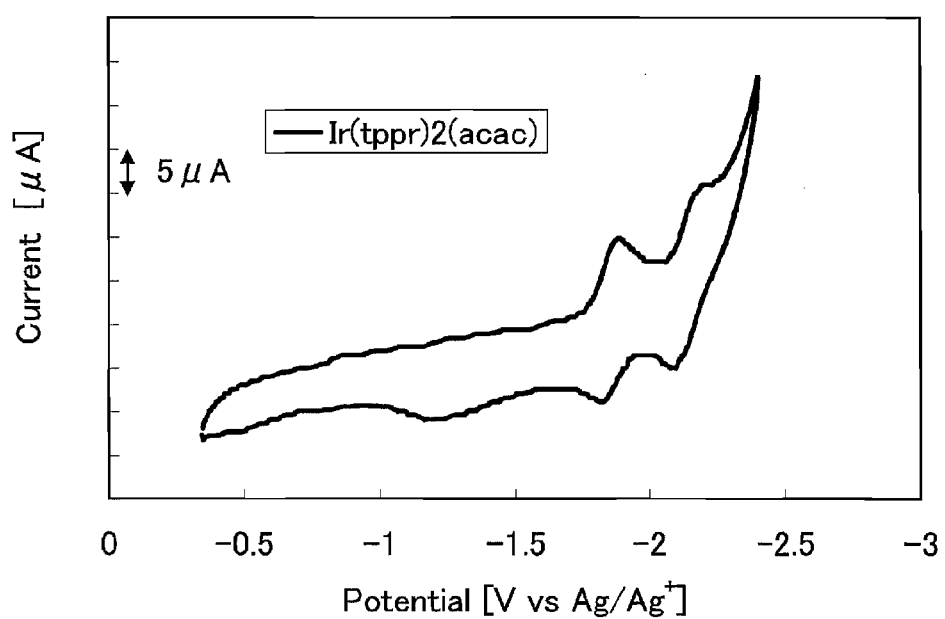
FIG. 30 is a graph showing reduction reaction characteristics of Ir(tppr)$_2$(acac).

FIG. 30 shows the measurement result of the reduction reaction characteristics. Note that in the measurement of the reduction reaction characteristics, the scan in which the electric potential of the working electrode with respect to the reference electrode was changed from −0.34 to −2.40 V, and then changed from −2.40 to −0.34 V was assumed as one cycle.

As shown in FIG. 30, a reduction peak potential $E_{pc}$ was −1.88 V and an oxidation peak potential $E_{pa}$ was −1.82 V. Accordingly, a half-wave potential (an intermediate potential between $E_{pc}$ and $E_{pa}$) can be calculated to be −1.85 V. This shows that Ir(tppr)$_2$(acac) can be reduced by electrical energy of −1.85 [V vs. Ag/Ag$^+$], and this energy corresponds to the LUMO level. Here, the potential energy of the reference electrode used in this embodiment with respect to the vacuum level is −4.85 [eV] as described above. Thus, it was found that the LUMO level of Ir(tppr)$_2$(acac) was −4.85−(−1.85)=−3.00 [eV].

Consequently, it is found that a value of a difference between the LUMO levels of BPAPQ and Ir(Fdpq)$_2$(acac) is −2.94−(−3.30)=0.36 [eV]. Accordingly, Ir(Fdpq)$_2$(acac) functions as an electron trap in the light-emitting element 1 manufactured in Embodiment 1 and the light-emitting element 3 manufactured in Embodiment 2. Thus, Ir(Fdpq)$_2$(acac) can be preferably used in the present invention. In particular, the value of the difference in the LUMO levels is greater than or equal to 0.3 eV, so that a greater effect can be obtained. Specifically, effects that carrier balance is further improved and light emission efficiency is high can be obtained.

Moreover, it is found that a value of a difference between the LUMO levels of BPAPQ and Ir(tppr)$_2$(acac) is −2.94−(−

3.00)=0.06 [eV]. Accordingly, it is found that Ir(tppr)$_2$(acac) functions as an electron trap in the light-emitting element 4 manufactured in Embodiment 3. Thus, Ir(tppr)$_2$(acac) can be preferably used in the present invention.

This application is based on Japanese Patent Application serial no. 2006-322425 filed in Japan Patent Office on Nov. 29, 2006, the entire contents of which are hereby incorporated by reference.

What is claimed is:

1. A light-emitting device comprising:
an anode and a cathode over a substrate;
an electron transporting layer and a hole transporting layer between the anode and the cathode;
a light-emitting layer between the electron transporting layer and the hole transporting layer,
wherein the light-emitting layer includes a first layer and a second layer in direct contact with the first layer,
wherein the first layer includes a first organic compound having an electron transporting property and a third organic compound having an electron trapping property,
wherein the second layer includes a second organic compound having a hole transporting property and the third organic compound having the electron trapping property, and
wherein an amount of the first organic compound contained in the first layer is larger than that of the third organic compound, and an amount of the second organic compound contained in the second layer is larger than that of the third organic compound.

2. The light-emitting device according to claim 1, wherein both of the first layer and the second layer contain a recombination region.

3. The light-emitting device according to claim 1, wherein the second organic compound contains a bipolar property.

4. The light-emitting device according to claim 1, wherein a lowest unoccupied molecular orbital level of the third organic compound is lower than that of the second organic compound by greater than or equal to 0.3 eV.

5. The light-emitting device according to claim 1, wherein the light-emitting device is incorporated in one selected from the group consisting of a television device, a computer, a mobile phone, a camera, an audio reproducing device, a digital player, a table lamp, and an indoor lighting system.

6. A light-emitting device comprising:
an anode and a cathode over a substrate;
an electron transporting layer and a hole transporting layer between the anode and the cathode;
a light-emitting layer between the electron transporting layer and the hole transporting layer,
wherein the light-emitting layer includes a first layer and a second layer in direct contact with the first layer,
wherein the first layer includes a first organic compound having an electron transporting property and a third organic compound having an electron trapping property,
wherein the second layer includes a second organic compound having a hole transporting property and the third organic compound having the electron trapping property,
wherein an amount of the first organic compound contained in the first layer is larger than that of the third organic compound, and an amount of the second organic compound contained in the second layer is larger than that of the third organic compound, and
wherein the first organic compound contains a metal complex, and the third organic compound emits phosphorescence.

7. The light-emitting device according to claim 6, wherein both of the first layer and the second layer contain a recombination region.

8. The light-emitting device according to claim 6, wherein the second organic compound contains a bipolar property.

9. The light-emitting device according to claim 6, wherein a lowest unoccupied molecular orbital level of the third organic compound is lower than that of the second organic compound by greater than or equal to 0.3 eV.

10. The light-emitting device according to claim 6, wherein the light-emitting device is incorporated in one selected from the group consisting of a television device, a computer, a mobile phone, a camera, an audio reproducing device, a digital player, a table lamp, and an indoor lighting system.

* * * * *